US012666963B2

(12) United States Patent　　　　(10) Patent No.:　　US 12,666,963 B2

Park　　　　　　　　　　　　　　　(45) Date of Patent:　　　Jun. 23, 2026

(54) IC PACKAGE WITH DUMMY DIE HEAT SPREADER

(71) Applicant: SAMSUNG ELECTRONICS CO., LTD., Suwon-si (KR)

(72) Inventor: Jin-Woo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 420 days.

(21) Appl. No.: 18/387,687

(22) Filed: Nov. 7, 2023

(65) Prior Publication Data

US 2024/0413037 A1　　Dec. 12, 2024

(30) Foreign Application Priority Data

Jun. 12, 2023　(KR) ........................ 10-2023-0075106

(51) Int. Cl.
*H10W 40/22*　　　(2026.01)
*H10B 80/00*　　　(2026.01)
　　　　(Continued)

(52) U.S. Cl.
CPC ........... *H10W 40/22* (2026.01); *H10B 80/00* (2023.02); *H10W 90/00* (2026.01); (Continued)

(58) Field of Classification Search
CPC ................. H10W 40/22; H10W 90/00; H10W 72/01338; H10W 72/01359; H10W 72/073; H10W 72/07331; H10W 72/07354; H10W 72/347; H10W 72/353; H10W 72/877; H10W 74/15; H10W 90/724; H10W 90/734; H10W 90/754; H10B 80/00; H01L 23/367; H01L 25/0657; H01L 25/18; H01L 2224/16227; H01L 2224/27452; H01L 2224/27845; H01L 2224/29186;
(Continued)

(56) References Cited

U.S. PATENT DOCUMENTS 8,933,564 B2　1/2015　Pelto et al.
10,049,999 B2　8/2018　Kim
(Continued)

FOREIGN PATENT DOCUMENTS

CN　　　104838495 A　　8/2015
WO　　2014/100278 A1　　6/2014

*Primary Examiner* — J.E. Schoenholtz
(74) *Attorney, Agent, or Firm* — Sughrue Mion, PLLC

(57) ABSTRACT

According to embodiments of the present disclosure, a semiconductor package is provided and may include: a substrate; a semiconductor chip on the substrate; a dummy chip on the semiconductor chip; and a first protection layer between the semiconductor chip and the dummy chip. The dummy chip may include: a semiconductor substrate including a first surface and a second surface, opposite to the first surface, the first surface being closer than the second surface to the semiconductor chip; a second protection layer on the first surface; and at least one penetration electrode penetrating the semiconductor substrate and the second protection layer. The at least one penetration electrode may be spaced apart from the semiconductor chip in a first direction perpendicular to a top surface of the semiconductor chip, and the first protection layer may be in contact with the second protection layer.

20 Claims, 29 Drawing Sheets

1

(51) Int. Cl.
　*H10W 72/00*　　(2026.01)
　*H10W 72/30*　　(2026.01)
　*H10W 74/15*　　(2026.01)
　*H10W 90/00*　　(2026.01)

(52) U.S. Cl.
　CPC　*H10W 72/01338* (2026.01); *H10W 72/01359*
　　　　(2026.01); *H10W 72/073* (2026.01); *H10W*
　　　　　*72/07331* (2026.01); *H10W 72/07354*
　　　　(2026.01); *H10W 72/347* (2026.01); *H10W*
　　　　*72/353* (2026.01); *H10W 72/877* (2026.01);
　　　　　*H10W 74/15* (2026.01); *H10W 90/724*
　　　　(2026.01); *H10W 90/734* (2026.01); *H10W*
　　　　　　　　　　　　　*90/754* (2026.01)

(58) Field of Classification Search
　CPC . H01L 2224/32225; H01L 2224/33181; H01L
　　　　　2224/48091; H01L 2224/48227; H01L
　　　　　2224/73204; H01L 2224/73253; H01L
　　　　　2224/83193; H01L 2224/83896; H01L
　　　　　2225/06513; H01L 2225/06517; H01L
　　　　　2225/06541; H01L 2225/06589; H01L
　　　　　2924/0504; H01L 2924/05442; H01L
　　　　　2924/059; H01L 2924/1431; H01L
　　　　　　2924/1436; H01L 2924/1438; H01L
　　　　　23/298; H01L 23/3171; H01L 23/3192;
　　　　　　H01L 23/3736; H01L 23/5386; H01L
　　　　　25/0655; H01L 25/105; H01L 2224/0812;
　　　　　　H01L 2225/06579; H01L 2225/1041
　　　　See application file for complete search history.

(56)　　　　　　References Cited

U.S. PATENT DOCUMENTS

| | | | |
|---|---|---|---|
| 10,867,879 | B2 | 12/2020 | Yu et al. |
| 11,302,643 | B2 | 4/2022 | Ganesan et al. |
| 11,393,777 | B2 | 7/2022 | Elsherbini et al. |
| 11,450,586 | B2 | 9/2022 | Chen et al. |
| 2014/0175651 | A1 | 6/2014 | Pelto et al. |
| 2021/0116637 | A1 | 4/2021 | Li et al. |
| 2021/0257277 | A1 | 8/2021 | Bertrand et al. |
| 2023/0369267 | A1* | 11/2023 | Zhao ................... H01L 25/0655 |
| 2024/0063089 | A1* | 2/2024 | Elsherbini ............. H01L 23/481 |
| 2024/0347510 | A1* | 10/2024 | Lee ...................... H01L 25/0657 |
| 2024/0371808 | A1* | 11/2024 | Kim ...................... H01L 23/481 |
| 2024/0404909 | A1* | 12/2024 | Lin ......................... H01L 25/50 |
| 2025/0309035 | A1* | 10/2025 | Sun ..................... H01L 23/3677 |

* cited by examiner

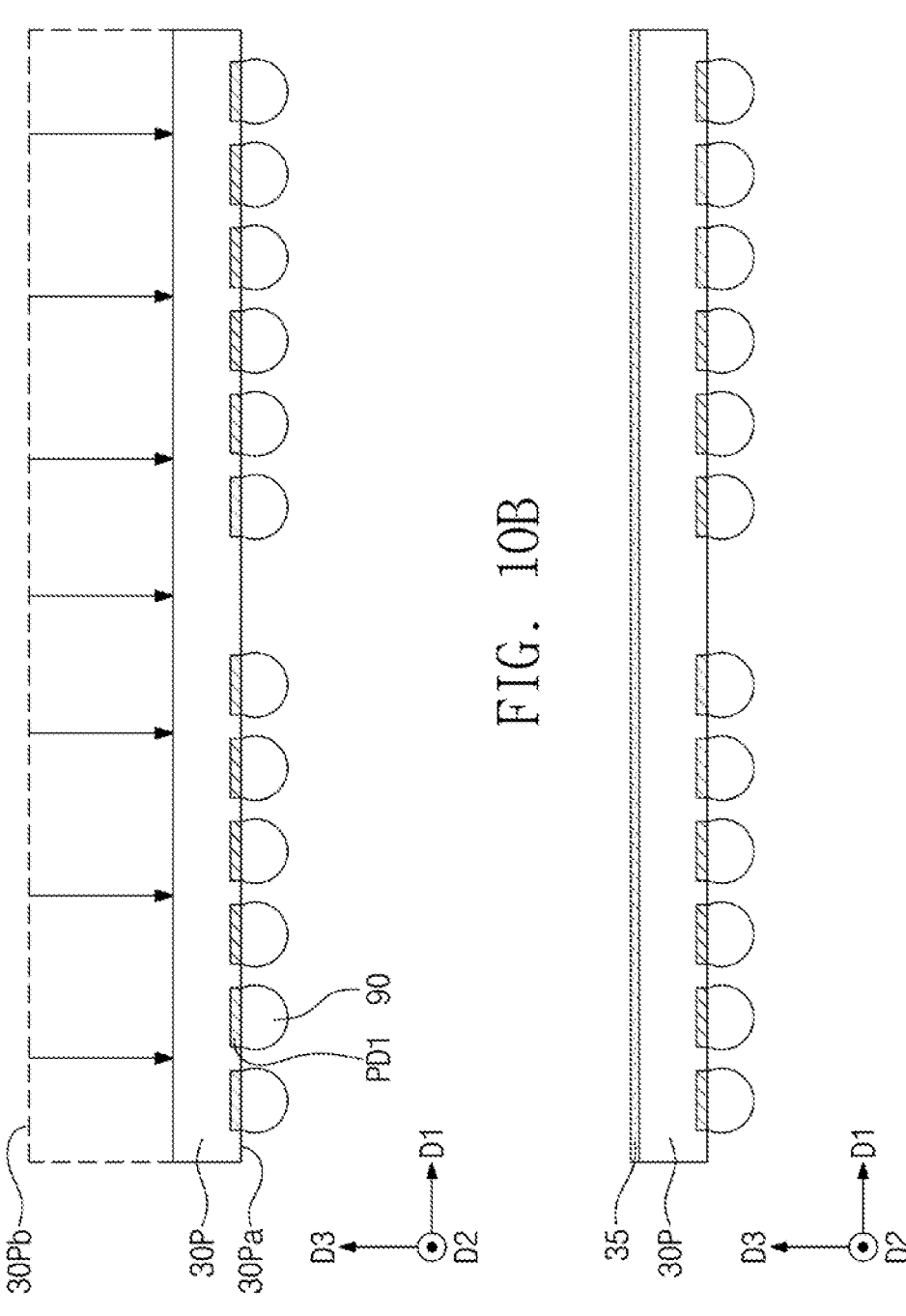

IC PACKAGE WITH DUMMY DIE HEAT SPREADER

CROSS-REFERENCE TO RELATED APPLICATION

This U.S. non-provisional patent application claims priority under 35 U.S.C. § 119 to Korean Patent Application No. 10-2023-0075106, filed on Jun. 12, 2023, in the Korean Intellectual Property Office, the entire contents of which are hereby incorporated by reference.

BACKGROUND

1. Technical Field

Embodiments of the present disclosure relate to a semiconductor package, and in particular, to a semiconductor package including a chip and a dummy chip thereon.

2. Description of Related Art

With the recent advance in the electronics industry, demand for high-performance, high-speed, and compact electronic components are increasing. To meet this demand, packaging technologies of mounting a plurality of semiconductor chips in a single package are being developed.

Recently, demand for portable electronic devices has been rapidly increasing in the market, and thus, it is necessary to reduce sizes and weights of electronic components constituting the portable electronic devices. For this, it is necessary to develop packaging technologies of reducing a size and a weight of each component and that integrate a plurality of individual components in a single package. Especially, for a semiconductor package in which a plurality of components are provided, it is necessary to improve warpage, heat-dissipation, and electric characteristics of the semiconductor package, in addition to the reducing of the size of the package.

SUMMARY

An embodiment of the present disclosure provides a semiconductor package with improved heat-dissipation efficiency and a method of fabricating the same.

According to embodiments of the present disclosure, a semiconductor package is provided and includes: a substrate; a semiconductor chip on the substrate; a dummy chip on the semiconductor chip; and a first protection layer between the semiconductor chip and the dummy chip. The dummy chip includes: a semiconductor substrate including a first surface and a second surface, opposite to the first surface, the first surface being closer than the second surface to the semiconductor chip; a second protection layer on the first surface; and at least one penetration electrode penetrating the semiconductor substrate and the second protection layer, wherein the at least one penetration electrode is spaced apart from the semiconductor chip in a first direction perpendicular to a top surface of the semiconductor chip, and wherein the first protection layer is in contact with the second protection layer.

According to embodiments of the present disclosure, a semiconductor package is provided and includes: a substrate; a semiconductor chip on the substrate; an interposer substrate between the substrate and the semiconductor chip; a chip stack on the interposer substrate; a dummy chip on the semiconductor chip; and a first protection layer between the semiconductor chip and the dummy chip, wherein the chip stack is spaced apart from the semiconductor chip in a first direction parallel to a top surface of the semiconductor chip. The dummy chip includes: a semiconductor substrate includes a first surface and a second surface, opposite to the first surface, the first surface being closer than the second surface to the semiconductor chip; a second protection layer on the first surface; and a penetration electrode penetrating the semiconductor substrate and the second protection layer, wherein the penetration electrode is spaced apart from the semiconductor chip in a second direction perpendicular to the top surface of the semiconductor chip, and wherein the first protection layer is in contact with the second protection layer.

According to embodiments of the present disclosure, a semiconductor package is provided and includes: a first sub-package; and a second sub-package on the first sub-package. The first sub-package includes: a lower redistribution substrate; a first semiconductor chip on the lower redistribution substrate; a dummy chip on the first semiconductor chip; and a first protection layer between the first semiconductor chip and the dummy chip. The dummy chip includes: a semiconductor substrate including a first surface and a second surface, opposite to the first surface, the first surface being closer than the second surface to the first semiconductor chip; a second protection layer on the first surface; and a penetration electrode penetrating the semiconductor substrate and the second protection layer, wherein the penetration electrode is spaced apart from the first semiconductor chip in a first direction perpendicular to a top surface of the first semiconductor chip, and wherein the first protection layer is in contact with the second protection layer. The second sub-package includes: an upper redistribution substrate; a second semiconductor chip on the upper redistribution substrate; and an upper substrate between the upper redistribution substrate and the second semiconductor chip.

BRIEF DESCRIPTION OF THE DRAWINGS

FIG. 2 is a sectional view taken along a line A-A' of FIG. 1.

FIG. 5 is a sectional view illustrating a semiconductor package according to an embodiment of the present disclosure.

FIG. 7A is a sectional view illustrating a semiconductor package according to an embodiment of the present disclosure.

FIG. 7B is a sectional view illustrating a semiconductor package according to an embodiment of the present disclosure.

FIGS. 10A to 10E are sectional views illustrating a process of fabricating a semiconductor package structure, according to an embodiment of the present disclosure.

FIGS. 10G to 10J are sectional views illustrating a process of fabricating a semiconductor package structure, according to an embodiment of the present disclosure.

DETAILED DESCRIPTION

Non-limiting example embodiments of the present disclosures will now be described more fully with reference to the accompanying drawings, in which example embodiments are shown.

It will be understood that when an element or layer is referred to as being "on," "connected to," or "coupled to" another element or layer, it can be directly on, connected to, or coupled to the other element or layer or intervening elements or layers may be present. In contrast, when an element or layer is referred to as being "directly on," "directly connected to," or "directly coupled to" another element or layer, there are no intervening elements or layers present.

Figure 1:
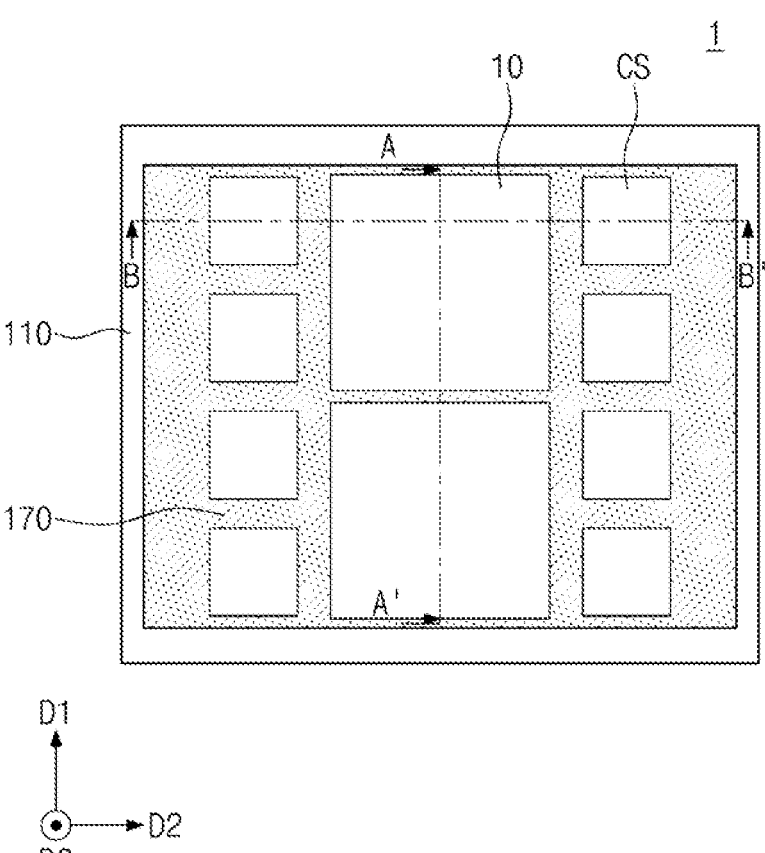
FIG. 1 is a plan view illustrating a semiconductor package structure according to an embodiment of the present disclosure.
Figure 2:
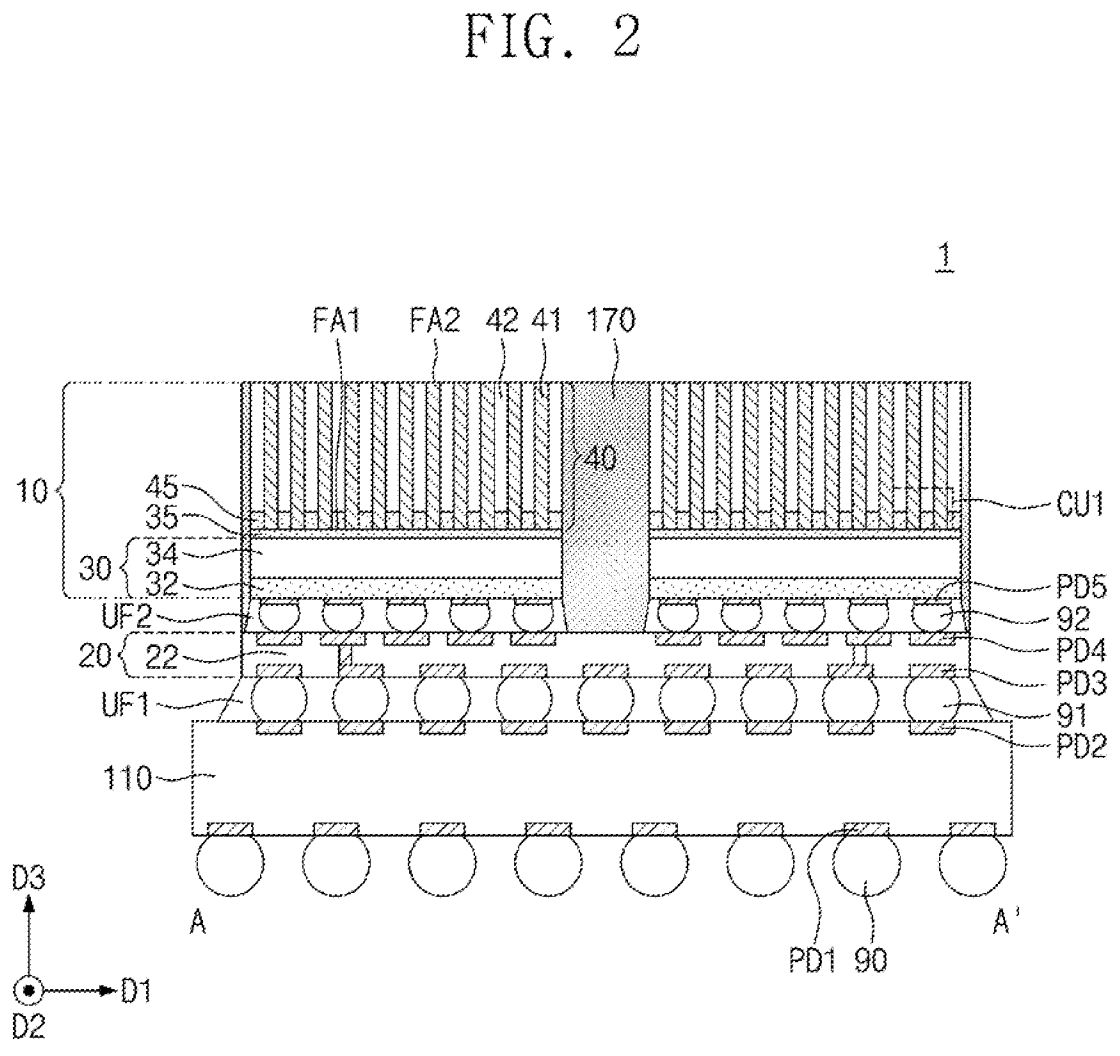
Figure 3:
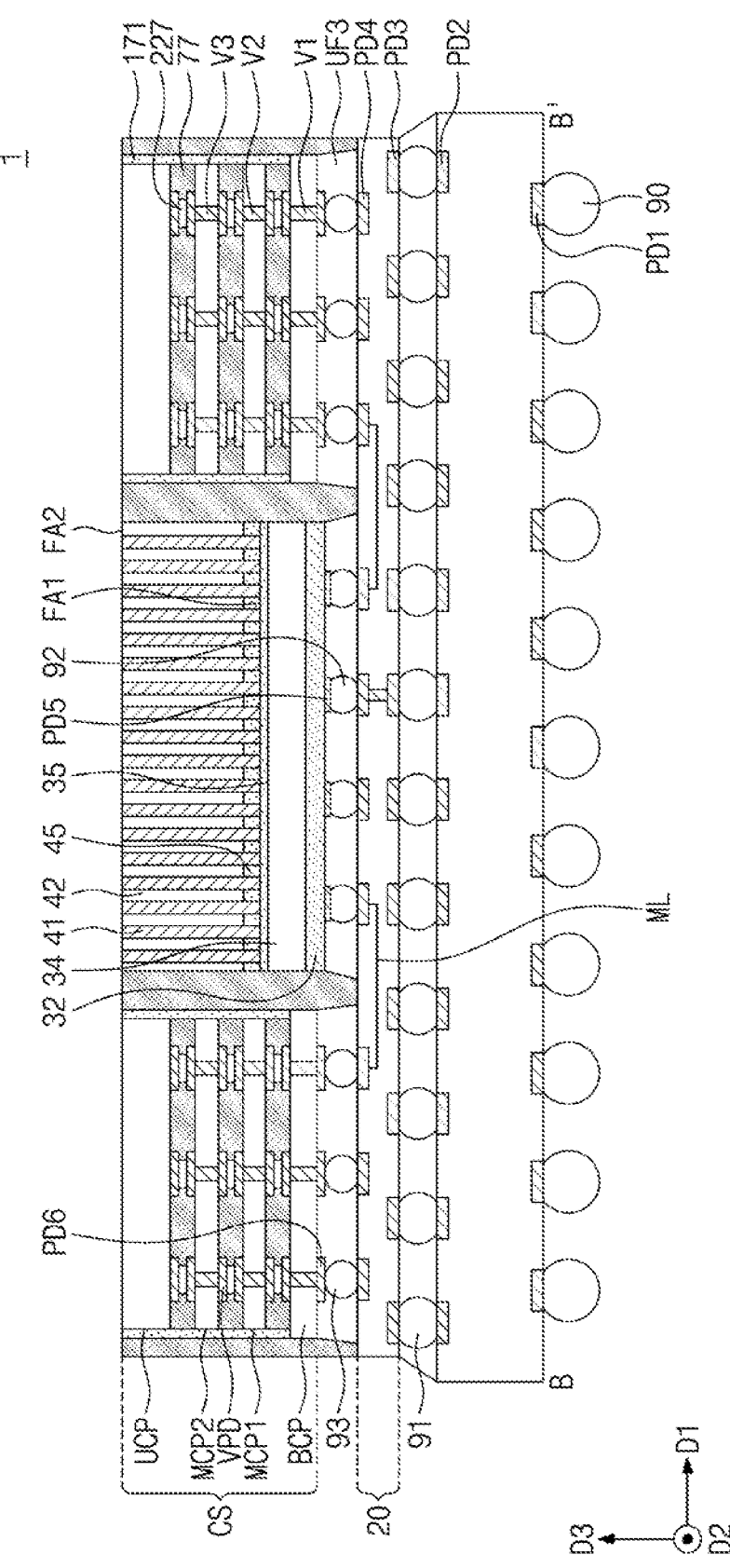
FIG. 3 is a sectional view taken along a line B-B' of FIG. 1.
Figure 4:
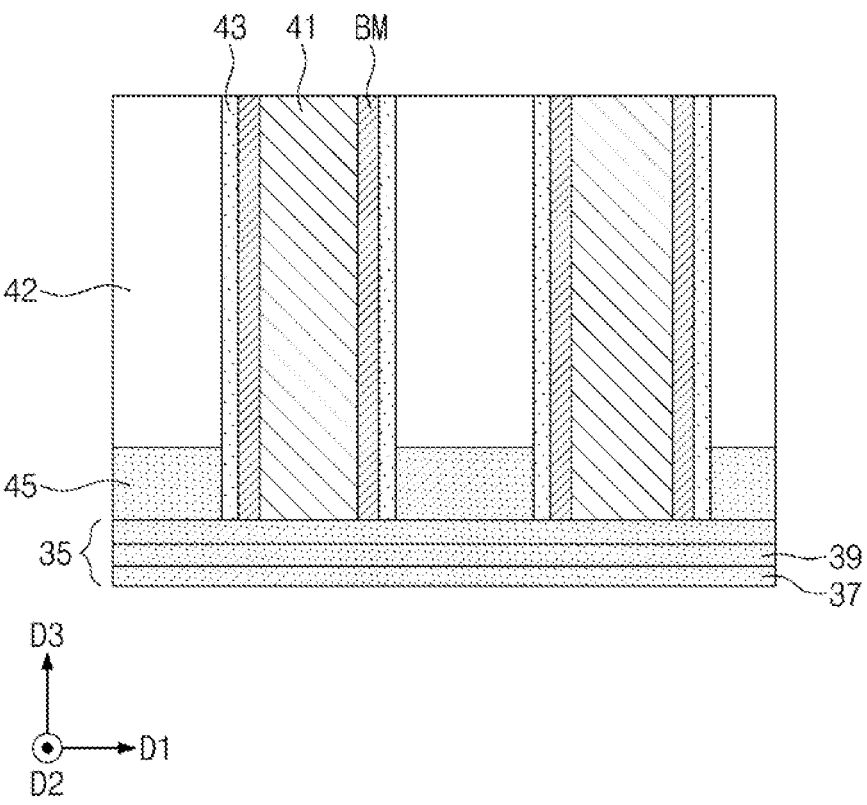
FIG. 4 is an enlarged sectional view illustrating a portion 'CU1' of FIG. 2.

FIG. 1 is a plan view illustrating a semiconductor package structure according to an embodiment of the present disclosure. FIG. 2 is a sectional view taken along a line A-A' of FIG. 1, and FIG. 3 is a sectional view taken along a line B-B' of FIG. 1. FIG. 4 is an enlarged sectional view illustrating a portion 'CU1' of FIG. 2.

Referring to FIGS. 1 to 3, a first semiconductor package 1 may include a package substrate 110, an interposer substrate 20, a first chip structure 10, a chip stack CS, and a first mold layer 170.

In the present specification, a first direction D1 may be defined to be parallel to a top surface of the package substrate 110. A second direction D2 may be defined as a direction that is parallel to the top surface of the package substrate 110 and is orthogonal to the first direction D1. A third direction D3 may be defined to be perpendicular to the top surface of the package substrate 110.

A plurality of the chip stack CS may be spaced apart from each other in the second direction D2, with the first chip structure 10 interposed therebetween. The plurality of the chip stack CS may also be arranged in the first direction D1 perpendicular to the second direction D2. Similarly, a plurality of the first chip structure 10 may be arranged in the first direction D1. The first mold layer 170 may be disposed to cover a side surface of the first chip structure 10 and side surfaces of the chip stack CS.

In an embodiment, the package substrate 110 may be a printed circuit board (PCB). Alternatively, the package substrate 110 may have a structure, in which insulating layers and interconnection layers are alternately stacked. The package substrate 110 may include a plurality of first pads PD1 on a bottom surface thereof and a plurality of second pads PD2 on a top surface thereof.

A plurality of a first outer connection terminal 90 may be disposed on the first pads PD1, respectively. The plurality of the first outer connection terminal 90 may be electrically connected to the substrate through the first pads PD1. The plurality of the first outer connection terminal 90 may include solder balls or solder bumps. Depending on the kind or arrangement of the plurality of the first outer connection terminal 90, the semiconductor package may have a ball grid array (BGA) structure, a fine ball-grid array (FBGA) structure, or a land grid array (LGA) structure. The first outer connection terminal 90 may be formed of or include an alloy that contains at least one of tin (Sn), silver (Ag), copper (Cu), nickel (Ni), bismuth (Bi), indium (In), antimony (Sb), or cerium (Ce).

The interposer substrate 20 may be provided on the package substrate 110. In an embodiment, the interposer substrate 20 may be a silicon interposer substrate. The interposer substrate 20 may include a third pad PD3 on a bottom surface thereof, a fourth pad PD4 on a top surface thereof, metal lines, and an interposer penetration via 22. The first chip structure 10 and the chip stack CS may be electrically connected to the package substrate 110 through the metal lines and the interposer penetration via 22. The first chip structure 10 may be connected to the chip stack CS through the metal lines.

First connection terminals 91 may be disposed between the package substrate 110 and the interposer substrate 20. In detail, the first connection terminals 91 may be interposed between the second pad PD2 and the third pad PD3 and may be in contact with the second pad PD2 and the third pad PD3. The interposer substrate 20 may be electrically connected to the package substrate 110 through the first connection terminals 91. The first connection terminals 91 may be formed a metallic material that is equal or similar to a metallic material of the first outer connection terminal 90.

A first under-fill layer UF1 may be provided between the package substrate 110 and the interposer substrate 20. The first under-fill layer UF1 may be provided to fill a space between the package substrate 110 and the interposer substrate 20 and enclose side surfaces of the first connection terminals 91. In an embodiment, the first under-fill layer UF1 may be formed of or include an epoxy resin.

The first chip structure 10 may be mounted on the interposer substrate 20. In an embodiment, a plurality of the first chip structure 10 may be provided. For example, two of the first chip structure 10 may be disposed to be spaced apart from each other in the first direction D1. The number and arrangement of the first chip structure 10 may be variously changed depending on a structure of the semiconductor package. In an embodiment, the semiconductor package structure may be configured to have just one first chip structure 10.

The first chip structure 10 may include a first semiconductor chip 30, a first protection layer 35, and a dummy chip 40.

The first semiconductor chip 30 may include a first semiconductor substrate 34 and an interconnection layer 32 on the first semiconductor substrate 34. The first semiconductor substrate 34 may be formed of or include a semiconductor material (e.g., silicon (Si)). The interconnection layer 32 may be disposed on a surface of the first semiconductor substrate 34. The interconnection layer 32 may include at least one insulating layer and interconnection portions in the insulating layer. The first semiconductor chip 30 may be a logic chip. For example, the first semiconductor chip 30 may be one from among a central processing unit (CPU), a graphics processing unit (GPU), and an application specific integrated circuit (ASIC).

The first protection layer 35 may be provided on the first semiconductor chip 30. In detail, the first protection layer 35 may be in contact with another surface of the first semiconductor substrate 34 that is opposite to the afore-mentioned surface of the first semiconductor substrate 34. The first protection layer 35 may be spaced apart from the interconnection layer 32 in the third direction D3. The first protection layer 35 may be formed of or include at least one from among silicon oxide ($SiO_2$), silicon nitride (SiN), silicon carbon nitride (SiCN), and silicon carboxide (SiCO).

The dummy chip 40 may be provided on the first protection layer 35. The dummy chip 40 may include a second semiconductor substrate 42, a penetration electrode 41, and a second protection layer 45. The second semiconductor substrate 42 may be formed of or include a semiconductor material (e.g., silicon (Si)). The second semiconductor substrate 42 may include a first surface FA1 and a second surface FA2, which are opposite to each other. The first surface FA1 may be closer than the second surface FA2 to the first semiconductor chip 30.

The second protection layer 45 may be provided on the first surface FA1 of the second semiconductor substrate 42. The second protection layer 45 may be bonded to the first protection layer 35 by a hybrid bonding process, which will be described below. The second protection layer 45 may be formed of or include at least one from among silicon oxide ($SiO_2$), silicon nitride (SiN), silicon carbon nitride (SiCN), and silicon carboxide (SiCO). A thickness of the second protection layer may range from 0.2 μm to 1 μm.

The penetration electrode 41 may be provided to penetrate the second semiconductor substrate 42 and the second protection layer 45. The penetration electrode 41 may be in contact with a top surface of the first protection layer 35 and may be spaced apart from the first semiconductor chip 30 in the third direction D3. In an embodiment, a plurality of penetration electrode 41 may be arranged in each of the first direction D1 and the second direction D2. The penetration electrode 41 may be formed of or include a material having high thermal conductivity. For example, the penetration electrode 41 may be formed of or include copper (Cu). In an embodiment, a level of a top surface of the penetration electrode 41 may be higher than a top surface of the second semiconductor substrate 42.

Referring to FIGS. 2 and 4, a barrier metal BM may be disposed on a side surface of the penetration electrode 41. A liner 43 may be disposed on a side surface of the barrier metal BM. The barrier metal BM may be interposed between the penetration electrode 41 and the liner 43. The liner 43 may be interposed between the barrier metal BM and the second semiconductor substrate 42. The barrier metal BM may be formed of or include at least one from among titanium (Ti), titanium nitride (TiN), and tungsten (W). The liner 43 may be formed of or include at least one from among silicon oxide ($SiO_2$), silicon nitride (SiN), silicon carbon nitride (SiCN), and silicon carboxide (SiCO). The barrier metal BM and the liner 43 may prevent copper atoms in the penetration electrode 41 from being diffused to the outside. The first protection layer 35 may be bonded to the second protection layer 45, and the penetration electrode 41 may be bonded to a top surface of the second protection layer 45. The first protection layer 35 and the second protection layer 45 may be bonded to form a hybrid bonding structure. In the present specification, the hybrid bonding structure may mean a bonding structure that is formed by two materials, which are of the same kind and are fused at an interface therebetween. That is, the first protection layer 35 and the second protection layer 45 may be formed of the same material (e.g., silicon oxide ($SiO_2$), silicon nitride (SiN), silicon oxynitride (SiON), or silicon carbon nitride (SiCN)). Meanwhile, the second protection layer 45 may include a first region 39 and a second region 37. An oxygen concentration in the first region 39 may be higher than an oxygen concentration in the second region 37. The first region 39 may be a region that is formed to have a hydroxide bonding structure of materials in the first protection layer 35 and the second protection layer 45. In this case, an adhesive strength between the first protection layer 35 and the second protection layer 45 may be improved, and this may make it possible to increase the structural stability of the semiconductor package.

Heat, which is generated in the first semiconductor chip 30, may be transferred to the dummy chip 40. In the dummy chip 40, the heat may be effectively exhausted to the outside through the penetration electrode 41.

The first semiconductor chip 30 may include a plurality of a fifth pad PD5 on a bottom surface thereof. The fifth pad PD5 may be connected to interconnection lines of the interconnection layer 32. A second connection terminal 92 may be disposed between the fifth pad PD5 and the fourth pad PD4. The first semiconductor chip 30 may be electrically connected to the interposer substrate 20 through the second connection terminal 92. The second connection terminal 92 may be formed a metallic material that is equal or similar to a metallic material of the plurality of the first outer connection terminal 90.

A second under-fill layer UF2 may be provided between the interposer substrate 20 and the first chip structure 10. The second under-fill layer UF2 may be provided to fill a space between the interposer substrate 20 and the first chip structure 10 and enclose side surfaces of the plurality of the second connection terminal 92. The second under-fill layer UF2 may be formed of or include an insulating material that is the same as or similar to an insulating material of the first under-fill layer UF1.

The first mold layer 170 may be provided to cover a top surface of the interposer substrate 20, a side surface of the first chip structure 10, and a side surface of the second under-fill layer UF2. The first mold layer 170 may be formed of or include at least one of insulating materials (e.g., epoxy molding compound or adhesive materials).

Referring back to FIGS. 1 and 3, the plurality of the chip stack CS may be disposed on the interposer substrate 20 such that they are spaced apart from each other in the second direction D2, with the first chip structure 10 interposed therebetween. Each chip stack CS may include a base chip BCP, first intermediate semiconductor chip MCP1, a second intermediate semiconductor chip MCP2, an upper semiconductor chip UCP, a non-conductive layer 77, a chip connection terminal 227, a second mold layer 171, and a protection layer. The first intermediate semiconductor chip MCP1, the second intermediate semiconductor chip MCP2, and the upper semiconductor chip UCP may be semiconductor chips of a same kind. The upper semiconductor chip UCP may be a semiconductor chip, which is placed at the uppermost level in the chip stack CS. In an embodiment, the upper semiconductor chip UCP may include the same memory integrated circuit as the memory integrated circuits in the first intermediate semiconductor chip MCP1 and the second intermediate semiconductor chip MCP2, although the upper semiconductor chip UCP may not include a second penetration via V2 and a third penetration via V3 to be described below or has a thickness different from thicknesses of the first intermediate semiconductor chip MCP1 and the second intermediate semiconductor chip MCP2.

Each of the first intermediate semiconductor chip MCP1, the second intermediate semiconductor chip MCP2, and the upper semiconductor chip UCP may be a memory chip. The first intermediate semiconductor chip MCP1, the second intermediate semiconductor chip MCP2, and the upper semiconductor chip UCP may be sequentially stacked on the base chip BCP. The number of the intermediate semiconductor chips, which are interposed between the base chip BCP and the upper semiconductor chip UCP, may be variously changed.

The base chip BCP may be a logic chip including a memory controller. The base chip BCP may include a first penetration via V1, the first intermediate semiconductor chip MCP1 may include the second penetration via V2, and the second intermediate semiconductor chip MCP2 may include the third penetration via V3.

A plurality of the chip connection terminal 227 may be disposed between the upper semiconductor chip UCP and the first intermediate semiconductor chip MCP1, between the first intermediate semiconductor chip MCP1 and the second intermediate semiconductor chip MCP2, and between the second intermediate semiconductor chip MCP2 and the base chip BCP. In an embodiment, the upper semiconductor chip UCP and the first intermediate semiconductor chip MCP1 may be electrically connected to each other through the chip connection terminal 227 and the third penetration via V3.

A plurality of a sixth pad PD6 may be provided on a bottom surface of the base chip BCP. A plurality of a third connection terminal 93 may be interposed between the sixth pad PD6 and the fourth pad PD4. The chip stack CS may be electrically connected to the interposer substrate 20 through the third connection terminal 93. The third connection terminal 93 may be formed a metallic material that is equal or similar to a metallic material of the first outer connection terminal 90.

A third under-fill layer UF3 may be provided between the base chip BCP and the interposer substrate 20. The third under-fill layer UF3 may be provided to fill a space between the base chip BCP and the interposer substrate 20 and enclose side surfaces of the plurality of the third connection terminal 93. The third under-fill layer UF3 may be formed of or include substantially the same or similar insulating material as the insulating material of the first under-fill layer UF1.

The first intermediate semiconductor chip MCP1 may be electrically connected to the base chip BCP through via pads VPD and the second penetration via V2. The via pads VPD may be formed of or include at least one of metallic materials (e.g., copper (Cu), aluminum (Al), and/or nickel (Ni)). The second intermediate semiconductor chip MCP2 may be electrically connected to the first intermediate semiconductor chip MCP and the upper semiconductor chip UCP through the via pads VPD and the third penetration via V3.

A top surface of the upper semiconductor chip UCP may be located at substantially the same level as a level of the second mold layer 171, which will be described below.

A plurality of the chip connection terminal 227 may be disposed between the base chip BCP and the first intermediate semiconductor chip MCP, between the first intermediate semiconductor chip MCP1 and the second intermediate semiconductor chip MCP2, and between the second intermediate semiconductor chip MCP2 and the upper semiconductor chip UCP. The chip connection terminal 227 may be a solder ball or a solder bump that is formed of at least one from among tin (Sn), silver (Ag), copper (Cu), nickel (Ni), bismuth (Bi), indium (In), antimony (Sb), cerium (Ce), and alloys thereof.

A plurality of the non-conductive layer 77 may be respectively provided between the base chip BCP and the first intermediate semiconductor chip MCP1, between the first intermediate semiconductor chip MCP1 and the second intermediate semiconductor chip MCP2, and between the second intermediate semiconductor chip MCP2 and the upper semiconductor chip UCP. The non-conductive layer 77 may be provided to enclose a side surface of the chip connection terminal 227. The non-conductive layer 77 may include a non-conductive film (NCF) or a non-conductive paste (NCP). The non-conductive layer 77 may be formed of or include an insulating polymer.

The second mold layer 171 may be provided on the base chip BCP. In detail, the second mold layer 171 may be provided to cover a portion of a top surface of the base chip BCP, side surfaces of the first intermediate semiconductor chip MCP1 and the second intermediate semiconductor chip MCP2, and a side surface of the upper semiconductor chip UCP. The second mold layer 171 may be formed of or include at least one of insulating materials (e.g., epoxy molding compound or adhesive materials).

Figure 5:
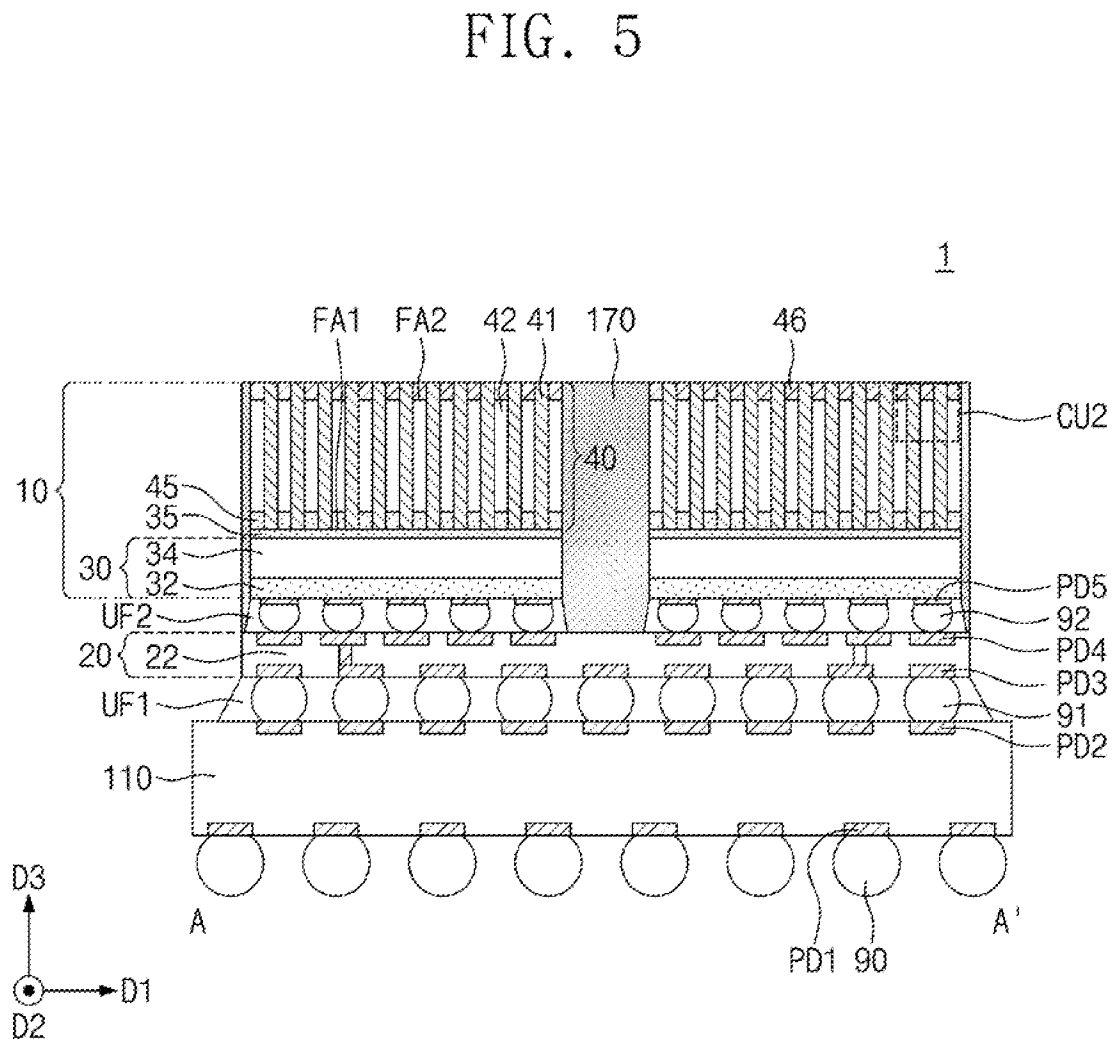
Figure 6:
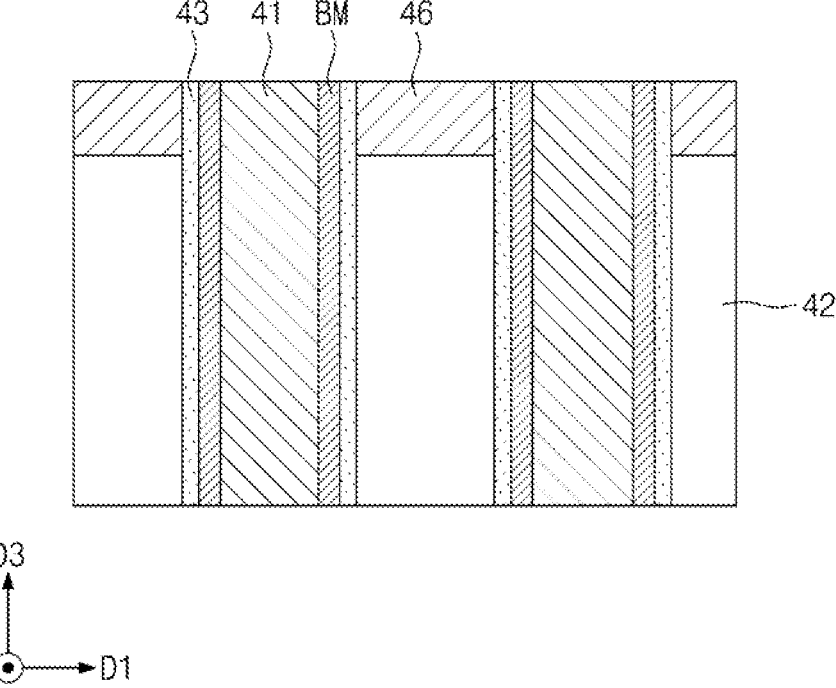
FIG. 6 is an enlarged sectional view illustrating a portion 'CU2' of FIG. 5.

FIG. 5 is a sectional view illustrating a semiconductor package according to an embodiment of the present disclosure. FIG. 5 is a sectional view taken along the line A-A' of FIG. 1. FIG. 6 is an enlarged sectional view illustrating a portion 'CU2' of FIG. 5. Except for features to be described below, the package according to the present embodiment may have substantially the same features as those described with reference to FIGS. 1 to 4, and thus, an overlapping description thereof may be omitted.

Referring to FIGS. 5 and 6, a thermally conductive layer 46 may be provided on the second surface FA2 of the second semiconductor substrate 42. A level of the second surface FA2 of the second semiconductor substrate 42 may be lower than a level of the top surface of the penetration electrode 41. That is, the penetration electrode 41 may protrude from the second surface FA2 of the second semiconductor substrate 42. The thermally conductive layer 46 may be provided to fill a space between a plurality of the penetration electrode 41.

A thickness of the thermally conductive layer 46 may range from 10 μm to 100 μm. The thermally conductive layer 46 may be formed of or include at least one from among aluminum (Al), aluminum oxide ($Al_2O_3$), aluminum nitride (AlN), magnesium oxide (MgO), and silicon carbide (SiC). The thermally conductive layer 46 may effectively exhaust heat, which is generated in the first semiconductor chip 30, to the outside.

Figure 7A:
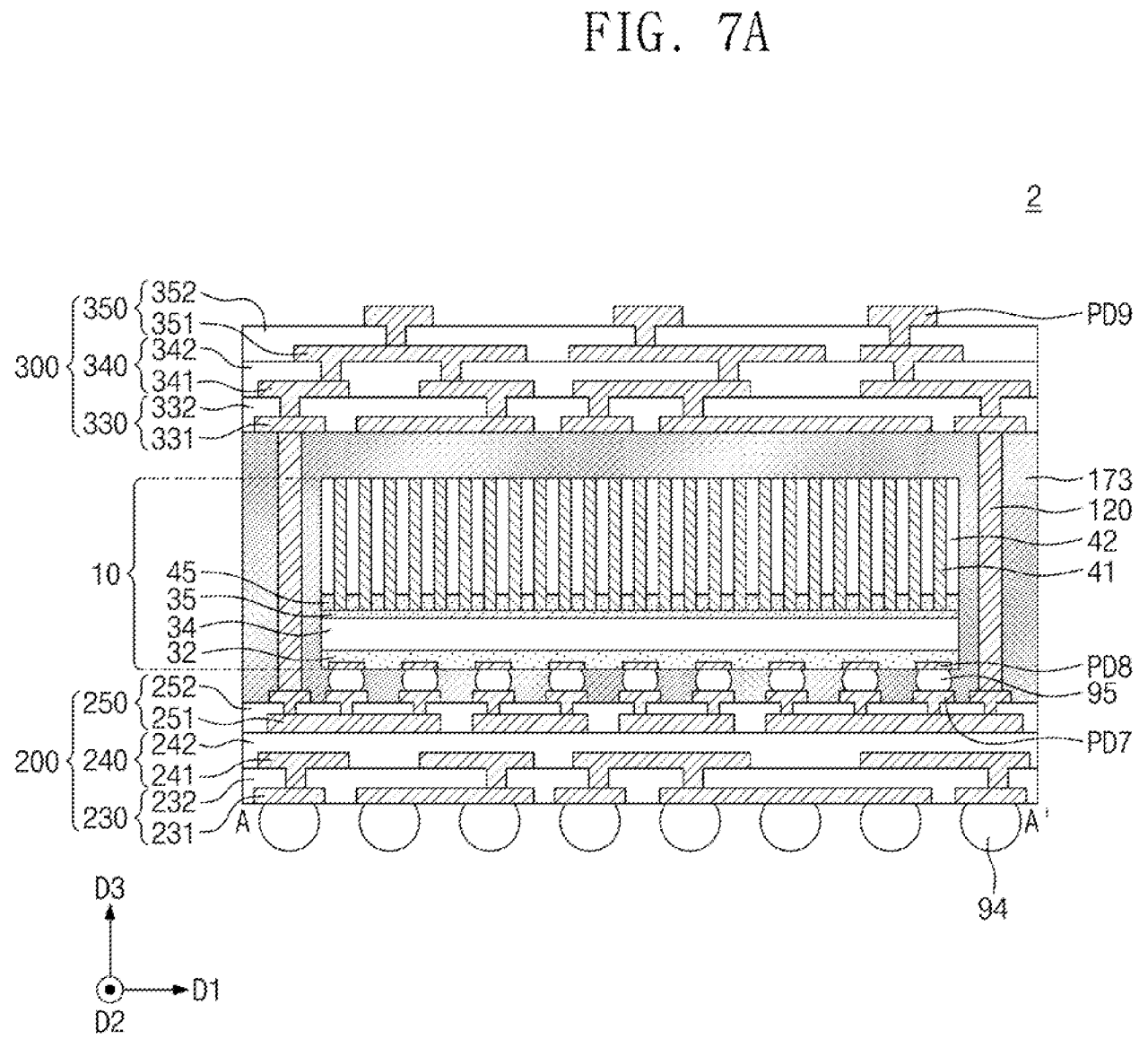

FIG. 7A is a sectional view illustrating a semiconductor package according to an embodiment of the present disclosure. An element previously described with reference to FIGS. 2 to 4 may be identified by the same reference number without repeating an overlapping description thereof. Referring to FIG. 7A, a second semiconductor package 2 may include a lower redistribution substrate 200, the first chip structure 10, a third mold layer 173, a conductive pillar 120, a plurality of a second outer connection terminal 94, and an upper redistribution substrate 300.

The lower redistribution substrate 200 may include a first redistribution layer 230, a second redistribution layer 240, and a third redistribution layer 250, which are sequentially stacked. FIG. 7A illustrates an example, in which the lower redistribution substrate 200 includes three redistribution layers, but embodiments of the present disclosure are not limited to this example. For example, at least one of the redistribution layers may be omitted from the lower redistribution substrate 200 or at least one additional redistribution layer may be added in the lower redistribution substrate 200.

The first redistribution layer 230 may include a first redistribution pattern 231 and a first insulating layer 232. The second redistribution layer 240 may include a second redistribution pattern 241 and a second insulating layer 242. The third redistribution layer 250 may include a third redistribution pattern 251, a third insulating layer 252, and a seventh pad PD7.

The first insulating layer 232, the second insulating layer 242, and the third insulating layer 252 may be formed of or include at least one from among photosensitive polyimide, polybenzoxazole, phenol-based polymers, and benzocyclobutene-based polymers.

In an embodiment, the first insulating layer 232, the second insulating layer 242, and the third insulating layer 252 may be formed of or include the same material, and in this case, there may be no observable interface therebetween. For example, the first insulating layer 232, the second insulating layer 242, and the third insulating layer 252 may be observed as a single insulating layer.

Each of the first redistribution pattern 231, the second redistribution pattern 241, and the third redistribution pattern 251 may include a seed/barrier pattern and a conductive pattern. In an embodiment, the seed/barrier pattern may be formed of or include copper/titanium. The conductive patterns may be formed of or include copper.

The second outer connection terminal 94 may be disposed on a bottom surface of the lower redistribution substrate 200. The first chip structure 10 may be mounted on the lower redistribution substrate 200. The first chip structure 10 may be electrically connected to the lower redistribution substrate 200 through a plurality of a third connection terminal 95, which are provided on a top surface of the lower redistribution substrate 200. In detail, the third connection terminal 95 may be interposed between the seventh pad PD7 of the third redistribution layer 250 and an eighth pad PD8 of the interconnection layer 32 of the first semiconductor chip 30. The second outer connection terminals 94 and the third connection terminals 95 may be formed a metallic material that is equal or similar to a metallic material of the first outer connection terminal 90.

The first chip structure 10 of FIG. 7A may have substantially the same chip structure as the chip structure of FIG. 2.

The conductive pillar 120 may be provided on the lower redistribution substrate 200. The conductive pillar 120 may be provided in the third mold layer 173. The conductive pillar 120 may be laterally spaced apart from the first chip structure 10 in the first direction D1. The conductive pillar 120 may be electrically connected to the first semiconductor chip 30 through the first redistribution pattern 231, the second redistribution pattern 241, and the third redistribution pattern 251. In an embodiment, the conductive pillar 120 may be formed of or include copper.

The third mold layer 173 may be disposed on the lower redistribution substrate 200 to cover the lower redistribution substrate 200. The third mold layer 173 may be provided to enclose a side surface of the conductive pillar 120 and side surfaces of the plurality of the third connection terminal 95, which are provided on the top surface of the lower redistribution substrate 200. The third mold layer 173 may be formed of or include at least one of insulating materials (e.g., epoxy molding compound or adhesive materials).

The upper redistribution substrate 300 may be disposed on a top surface of the third mold layer 173 and a top surface of the conductive pillar 120. The upper redistribution substrate 300 may include a fourth redistribution layer 330, a fifth redistribution layer 340, and a sixth redistribution layer 350, which are sequentially stacked. FIG. 7A illustrates an example, in which the upper redistribution substrate 300 includes three redistribution layers, but embodiments of the present disclosure are not limited to this example. For example, at least one of the redistribution layers may be omitted from the upper redistribution substrate 300 or at least one additional redistribution layer may be added in the upper redistribution substrate 300.

The fourth redistribution layer 330 may include a fourth redistribution pattern 331 and a fourth insulating layer 332. The fifth redistribution layer 340 may include a fifth redistribution pattern 341 and a fifth insulating layer 342. The sixth redistribution layer 350 may include a sixth redistribution pattern 351, a sixth insulating layer 352, and a ninth pad PD9.

The fourth insulating layer 332, the fifth insulating layer 342 and the sixth insulating layer 352 may include at least one from among photo-sensitive polyimide, poly(benzoxazole), phenol-based polymers, or benzocyclobutene-based polymers.

In an embodiment, the fourth insulating layer 332, the fifth insulating layer 342, and the sixth insulating layer 352 may be formed of or include the same material, and in this case, there may be no observable interface therebetween. In other words, the fourth insulating layer 332, the fifth insulating layer 342, and the sixth insulating layer 352 may be observed as a single insulating layer.

Each of the fourth redistribution pattern 331, the fifth redistribution pattern 341, and the sixth redistribution pattern 351 may include a seed/barrier pattern and a conductive pattern. In an embodiment, the seed/barrier pattern may be formed of or include copper/titanium. The conductive patterns may be formed of or include copper.

Figure 7B:
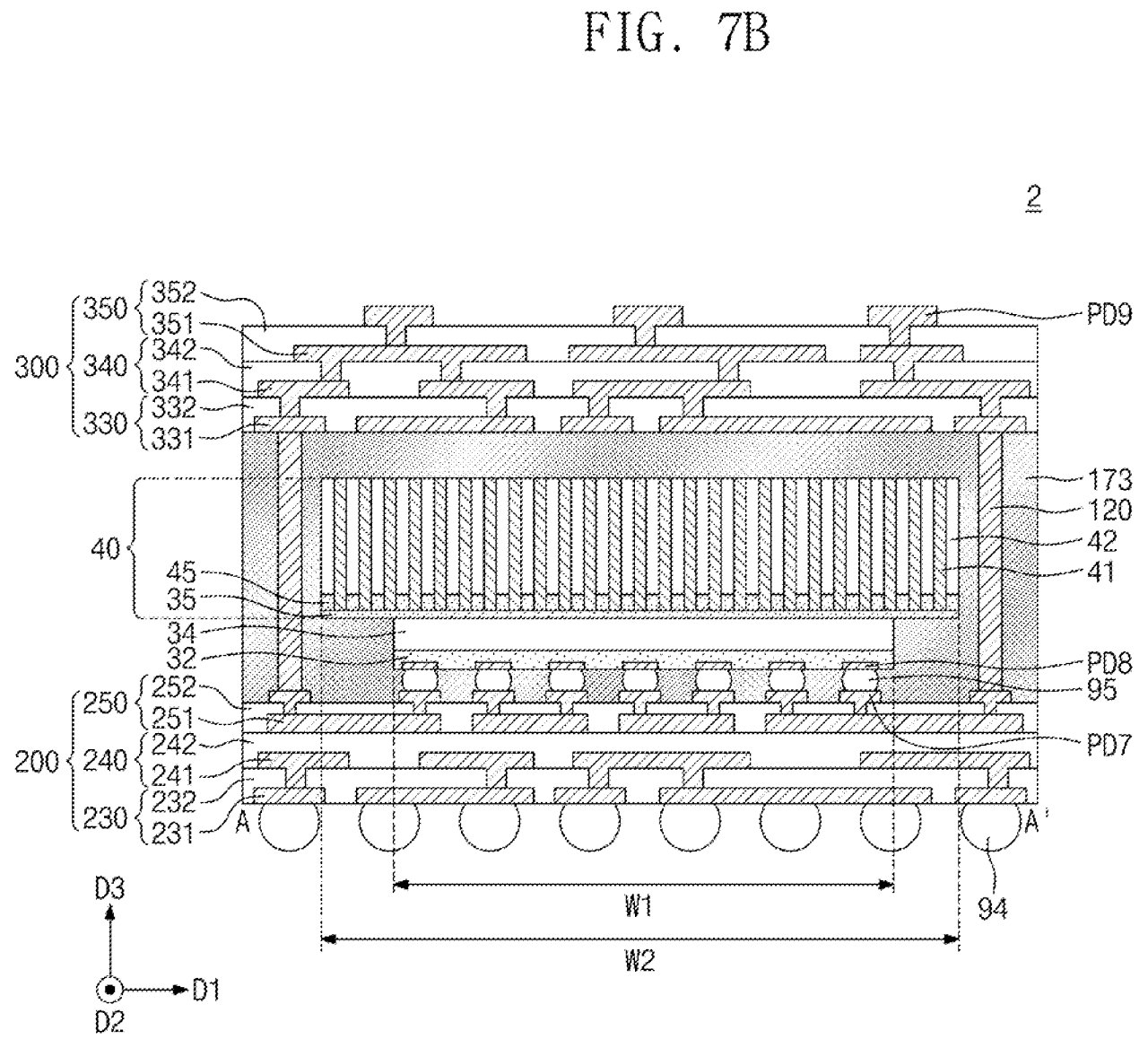

FIG. 7B is a sectional view illustrating a semiconductor package according to an embodiment of the present disclosure. For concise description, an element previously described with reference to FIG. 7A may be identified by the same reference number without repeating an overlapping description thereof.

Referring to FIG. 7B, the first semiconductor chip 30 may have a first width W1 in the first direction D1. The dummy chip 40 may have a second width W2 in the first direction D1. The first width W1 may be smaller than the second width W2. In other words, the first semiconductor chip 30 may be shorter than the dummy chip 40 in the first direction D1.

Figure 7C:
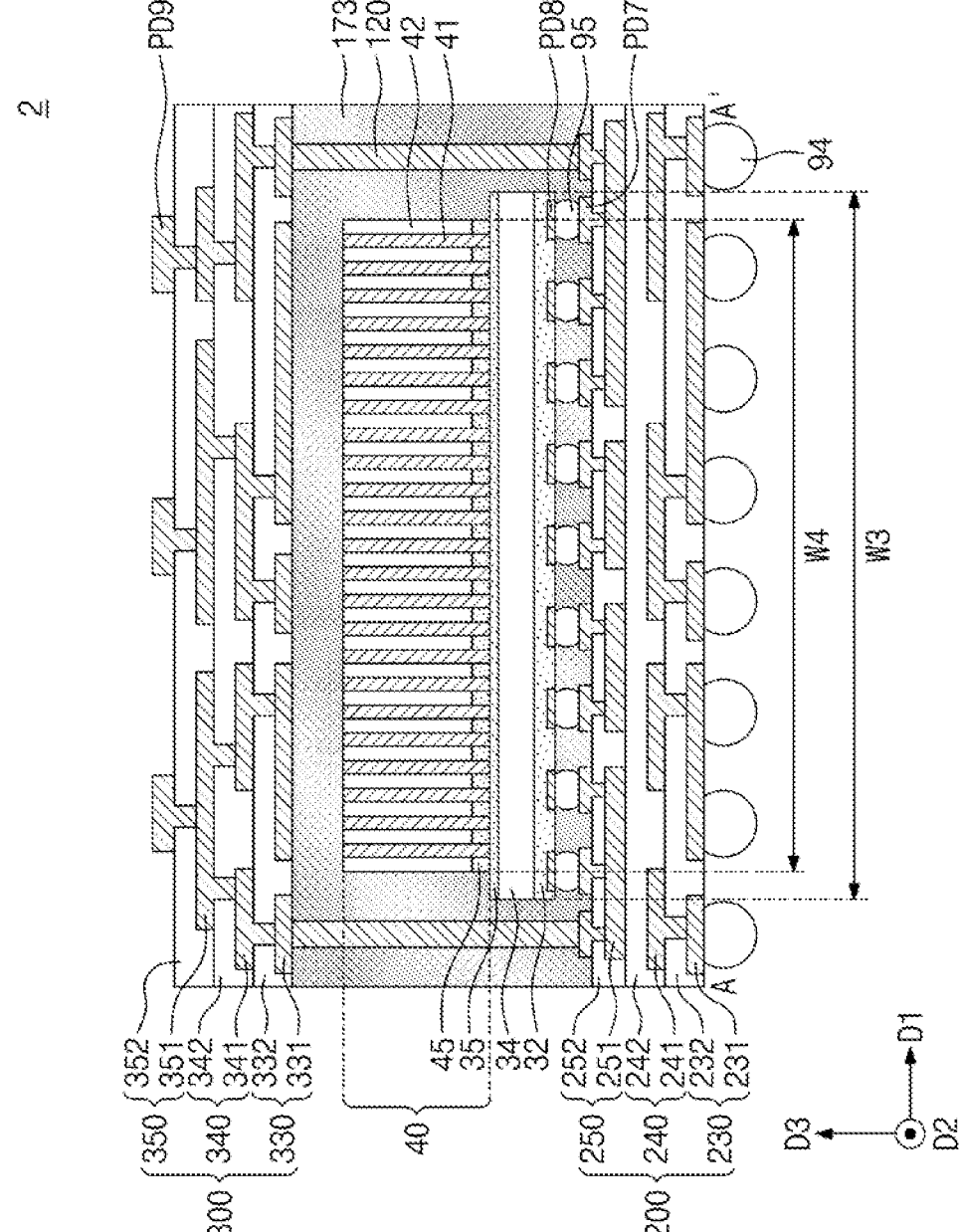
FIG. 7C is a sectional view illustrating a semiconductor package according to an embodiment of the present disclosure.

FIG. 7C is a sectional view illustrating a semiconductor package according to still other embodiment of the present disclosure. For concise description, an element previously described with reference to FIG. 7A may be identified by the same reference number without repeating an overlapping description thereof.

Referring to FIG. 7C, the first semiconductor chip 30 may have a third width W3 in the first direction D1. The dummy chip 40 may have a fourth width W4 in the first direction D1. The third width W3 may be larger than the fourth width W4. In other words, the first semiconductor chip 30 may be longer in the first direction D1 than the dummy chip 40.

Figure 8:
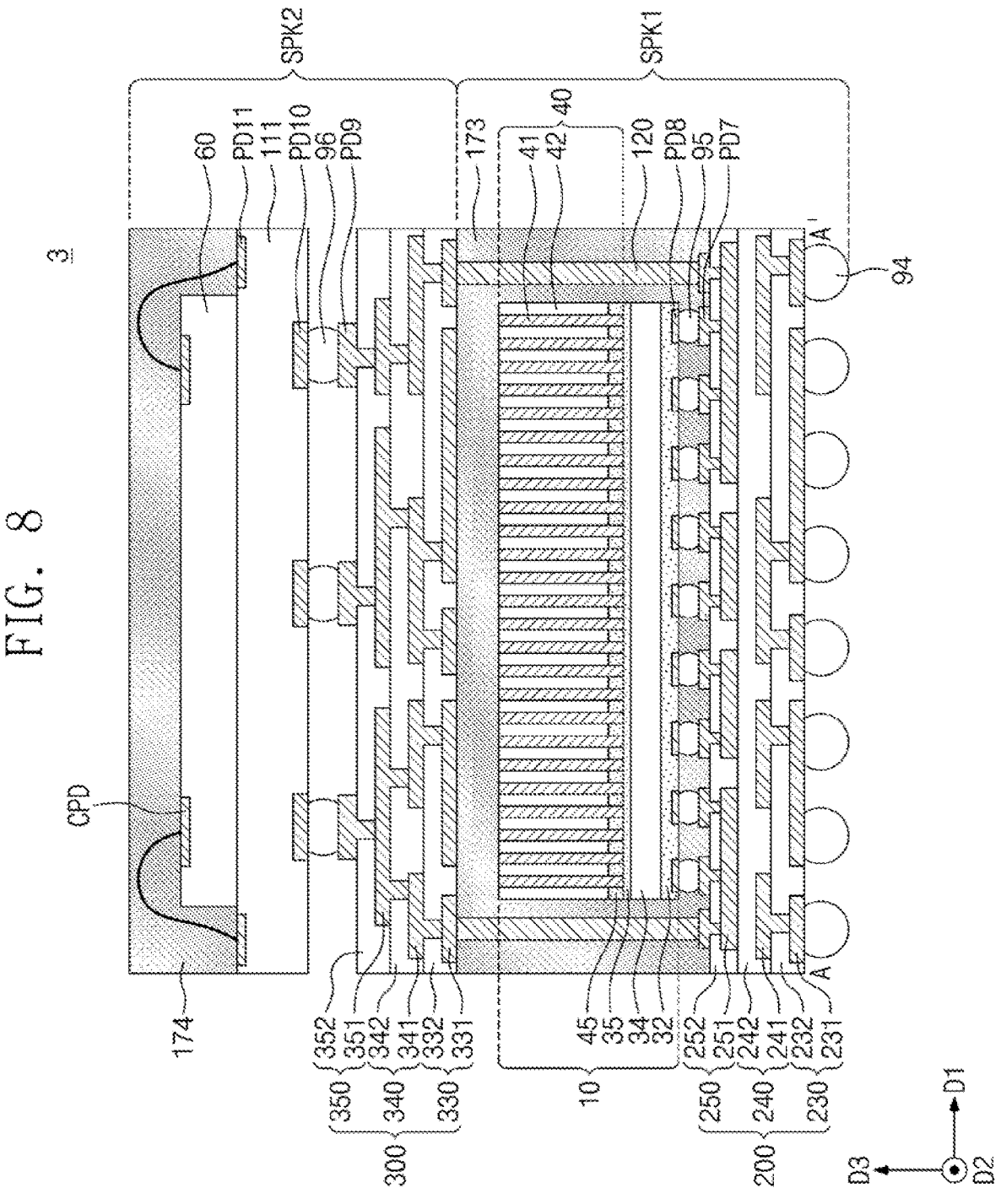
FIG. 8 is a sectional view illustrating a semiconductor package according to an embodiment of the present disclosure.

FIG. 8 is a sectional view illustrating a semiconductor package according to an embodiment of the present disclosure. For concise description, an element previously described with reference to FIG. 7A may be identified by the same reference number without repeating an overlapping description thereof.

Referring to FIG. 8, a third semiconductor package 3 may include a first sub-package SPK1 and a second sub-package SPK2 on the first sub-package SPK1. The second sub-package SPK2 may include an upper substrate 111, a fourth mold layer 174, and a second semiconductor chip 60.

The upper substrate 111 may be disposed on the upper redistribution substrate 300. In an embodiment, the upper substrate 111 may include a printed circuit board (PCB). In an embodiment, the upper substrate 111 may be a redistribution substrate. The upper substrate 111 may include a plurality of a tenth pad PD10 on a bottom surface thereof and a plurality of an eleventh pad PD11 on a top surface thereof. A plurality of a sixth connection terminal 96 may be disposed on the plurality of the tenth pad PD10, respectively. The upper substrate 111 may be electrically connected to the upper redistribution substrate 300 through the plurality of the sixth connection terminal 96. The sixth connection terminal 96 may be formed a metallic material that is equal or similar to a metallically material of the first outer connection terminal 90.

The second semiconductor chip 60 may be disposed on the upper substrate 111. The second semiconductor chip 60 may be a different type of semiconductor chip than the first semiconductor chip 30. In an embodiment, the second semiconductor chip 60 may be a memory chip (e.g., a dynamic random access memory (DRAM) or NAND FLASH chip). A chip pad CPD, which is disposed on a surface of the second semiconductor chip 60, may be electrically connected to the eleventh pad PD11 of the upper substrate 111 in a wire bonding manner.

The fourth mold layer 174 may be disposed on the upper substrate 111 and the second semiconductor chip 60. The fourth mold layer 174 may be provided to cover a portion of a top surface of the upper substrate 111 and top and side surfaces of the second semiconductor chip 60. The fourth mold layer 174 may be formed of or include at least one of insulating materials (e.g., epoxy molding compound or adhesive materials).

Figure 9:
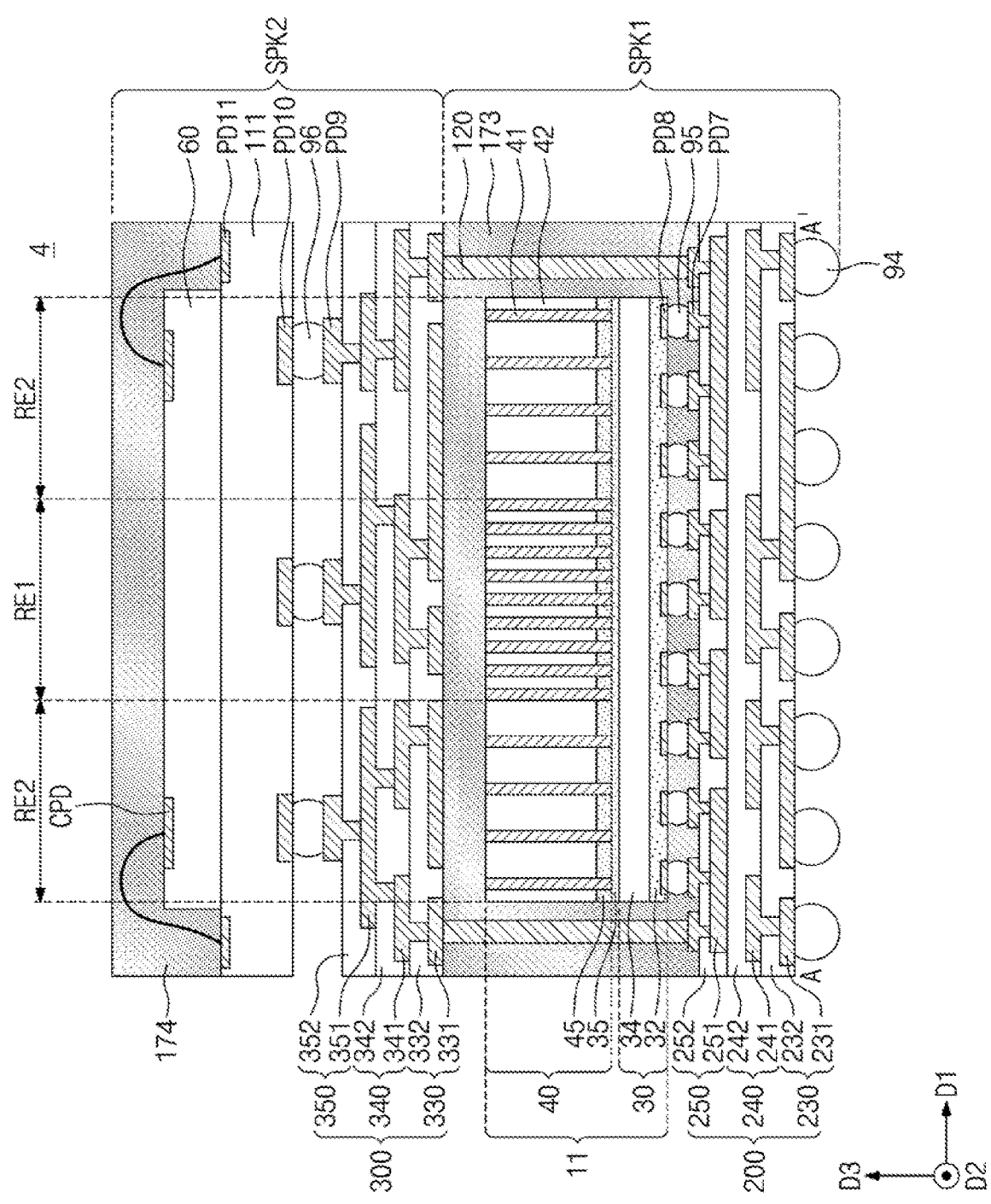
FIG. 9 is a sectional view illustrating a semiconductor package according to an embodiment of the present disclosure.

FIG. 9 is a sectional view illustrating a semiconductor package 4 according to an embodiment of the present disclosure. For concise description, an element previously described with reference to FIG. 8 may be identified by the same reference number without repeating an overlapping description thereof.

Referring to FIG. 9, the dummy chip 40 may include a first region RE1 and a second region RE2 surrounding the first region RE1.

The first region RE1 and the second region RE2 may be provided to have different lengths from the illustrated example, and embodiments of the present disclosure are not limited to specific lengths of the first region RE1 and the second region RE2. A number of the penetration electrode 41 in the first region RE1 may be greater than a number of the penetration electrode 41 in the second region RE2. In detail, a plurality of the penetration electrode 41 may be provided, and the number of the penetration electrode 41 per unit area may be greater in the first region RE1 than in the second region RE2. In other words, the penetration electrode 41 may be provided more in a region of the dummy chip 40, which is located on a portion of the first semiconductor chip 30 serving as a main heat source, compared to other regions of the dummy chip 40. As a result, the semiconductor package 4 may have a highly-efficient heat-dissipation structure. In addition, the width of the penetration electrode 41 in the first direction D1 may be increased to improve the heat-dissipation ability, and this may make it possible to further improve the heat-dissipation characteristics of the semiconductor package.

Figures 10C, 10D:
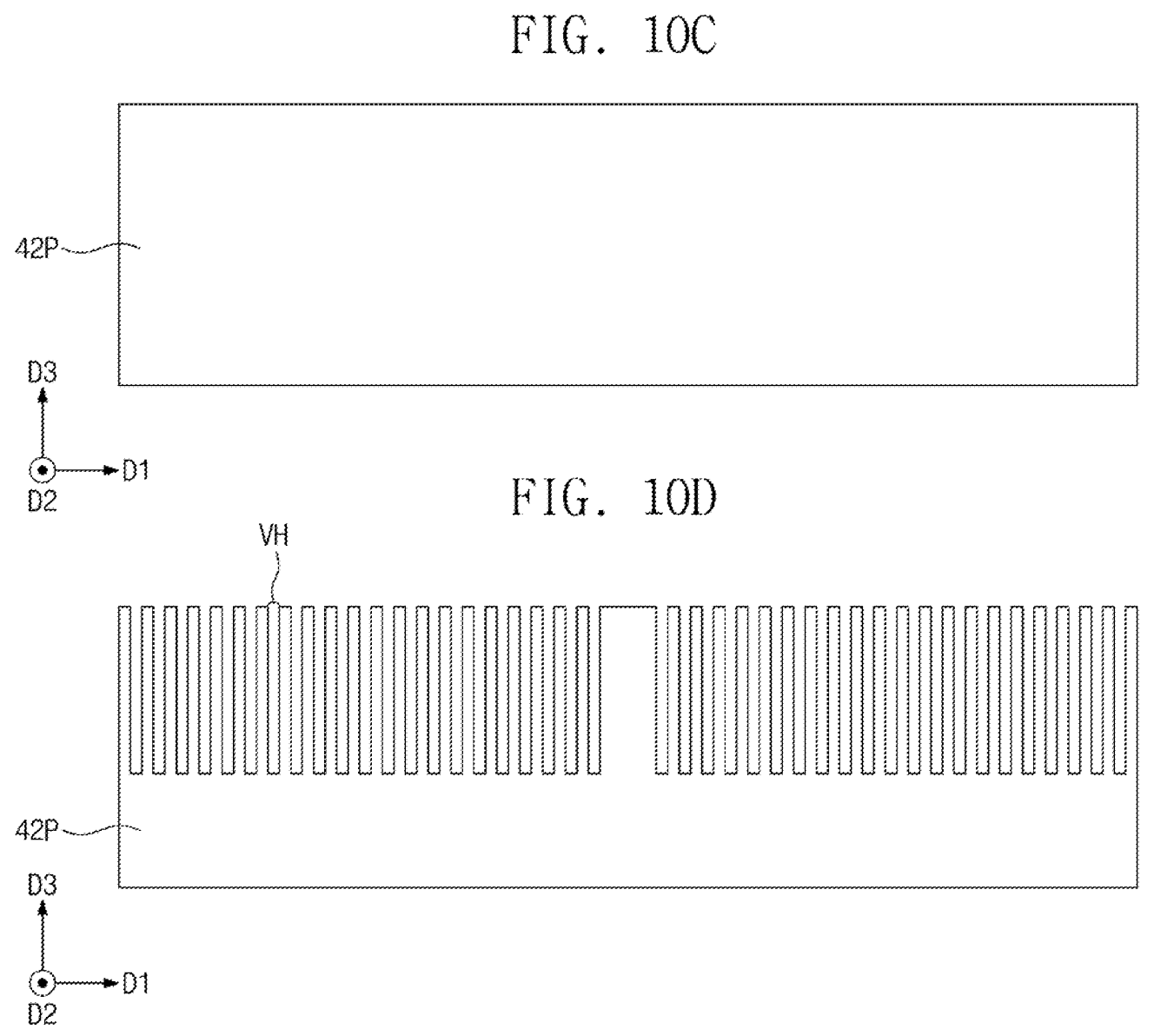
Figure 10E:
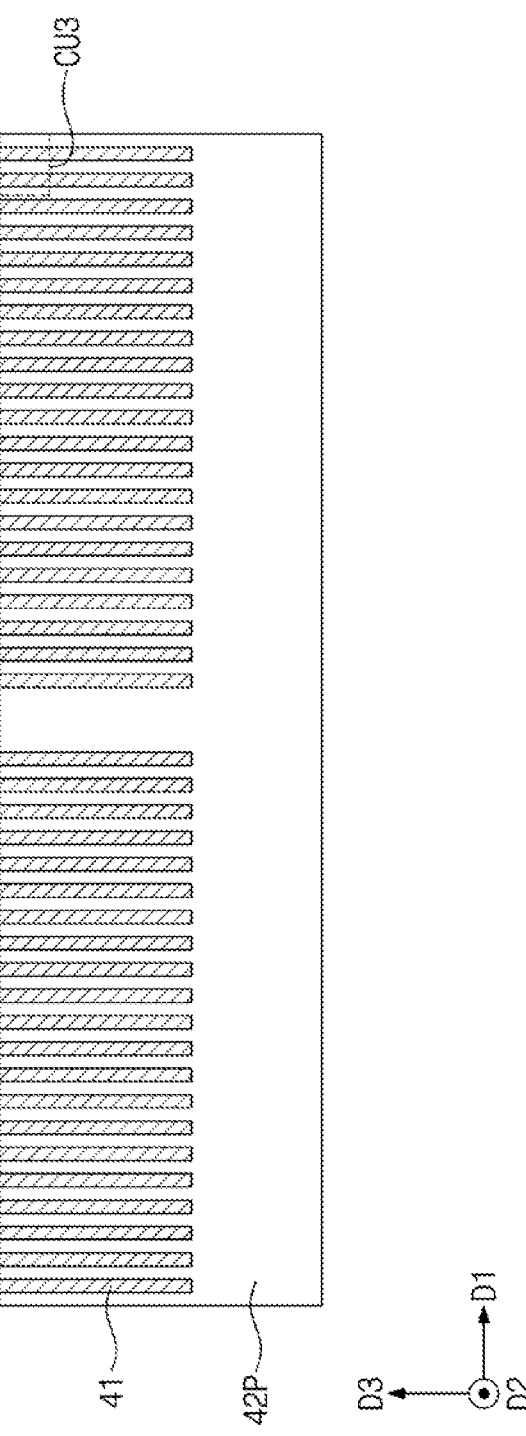

FIG. 10A to 10E are sectional views illustrating a process of fabricating a semiconductor package structure, according to an embodiment of the present disclosure. Referring to FIG. 10A, a first wafer 30P may be provided. The first wafer 30P may include a plurality of semiconductor chip forming regions. The semiconductor chip forming regions may designate the regions of the first wafer 30P that correspond to the plurality of the first semiconductor chip 30, which will be separated from each other through a subsequent sawing process. The first wafer 30P may include a first surface 30Pa and a second surface 30Pb, which are opposite to each other. The first pad PD1 may be formed on the first surface 30Pa of the first wafer 30P. The first outer connection terminal 90 may be formed on the first pad PD1. Thereafter, a grinding process may be performed on the second surface 30Pb of the first wafer 30P to remove a portion of the first wafer 30P. As a result of the grinding process, a thickness of the first wafer 30P in the third direction D3 may be reduced.

Referring to FIG. 10B, the first protection layer 35 may be formed on the first wafer 30P, after the grinding process. The first protection layer 35 may be formed by a chemical vapor deposition process. Thereafter, an etch-back or chemical mechanical polishing (CMP) process may be performed on the first protection layer 35 to planarize the first protection layer 35.

Referring to FIG. 10C, a second wafer 42P may be provided. In an embodiment, the second wafer 42P may be a bulk semiconductor substrate and may be formed of or include a semiconductor material (e.g., silicon (Si)). The second wafer 42P may include a plurality of dummy chip forming regions. The dummy chip forming regions may designate the regions of the second wafer 42P that correspond to a plurality of the the dummy chip 40, which will be separated from each other through a subsequent sawing process.

Referring to FIG. 10D, a plurality of a via hole VH may be formed in the second wafer 42P. For example, an etching process using a mask pattern as an etch mask may be performed on the second wafer 42P. The formation of the mask pattern may include coating, exposing, and developing a photoresist layer. As a result of the etching process, a plurality of the via hole VH may be formed in the second wafer 42P. In an embodiment, the etching process may be performed to form the plurality of the via hole VH extending in the third direction D3 and leave a lower portion of the second wafer 42P. Thereafter, the mask pattern may be removed.

Figure 10F:
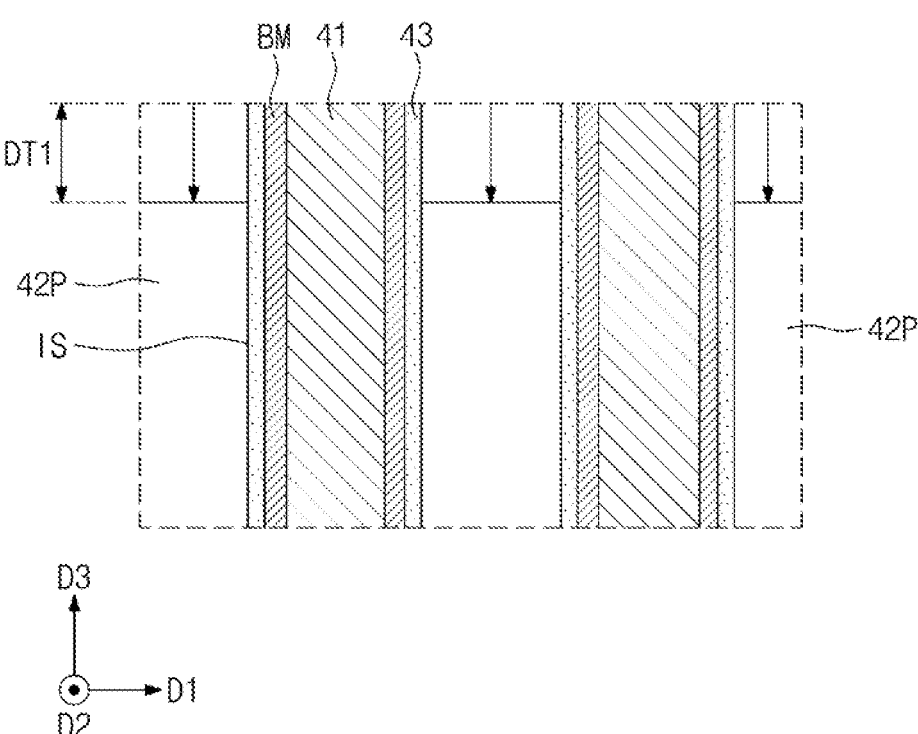
FIG. 10F is an enlarged sectional view illustrating a portion 'CU3' of FIG. 10E.

FIG. 10F is an enlarged sectional view illustrating a portion 'CU3' of FIG. 10E. Referring to FIGS. 10E and 10F, the liner 43 may be formed on an inner surface IS of the via hole VH of FIG. 10D. Next, the barrier metal BM may be formed on a side surface of the liner 43. Thereafter, the penetration electrode 41 may be formed to fill an internal or unfilled space of the via hole VH provided with the barrier metal BM and the liner 43. In detail, the formation of the penetration electrode 41 may include filling the internal space of the via hole VH with a conductive material (e.g., copper (Cu)) through a plating process. To fill the internal space of the via hole VH without a process defect, an organic additive agent may be used in the plating process.

An upper portion of the second wafer 42P may be removed by an etching process. A top surface of the second wafer 42P may be exposed to the outside using a method similar to the method described earlier, and here, a mask pattern may be formed to cover the top surface of the penetration electrode 41. A selective etching process may be performed on the exposed top surface of the second wafer 42P using the mask pattern as an etch mask. The etching process may be executed to recess the top surface of the second wafer 42P by a first depth DT1 in the third direction D3. As a result, the first length may be substantially equal to a thickness of the second protection layer 45, which will be described below. The first depth DT1 may range from 0.2 μm to 1 μm.

Figure 10G:
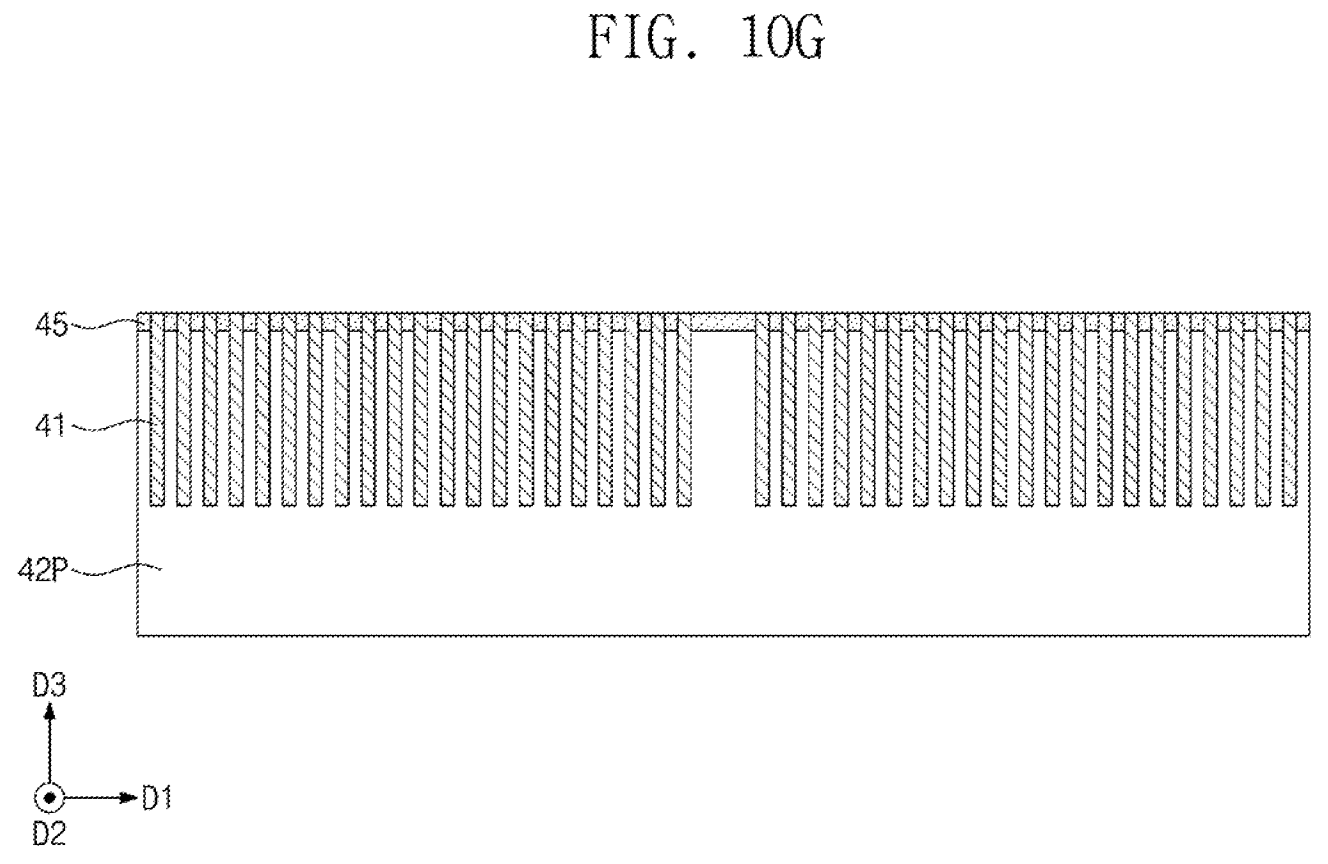

Next, referring to FIG. 10G, the second protection layer 45 may be formed to fill the recessed space, which is formed on the top surface of the second wafer 42P by the etching process of FIG. 10F. The second protection layer 45 may be formed by a chemical vapor deposition process. A thickness of the second protection layer 45 may range from 0.2 μm to 1 μm. Thereafter, an etch-back or chemical mechanical polishing (CMP) process may be performed on the first protection layer 35 to planarize the second protection layer 45.

Figure 10H:
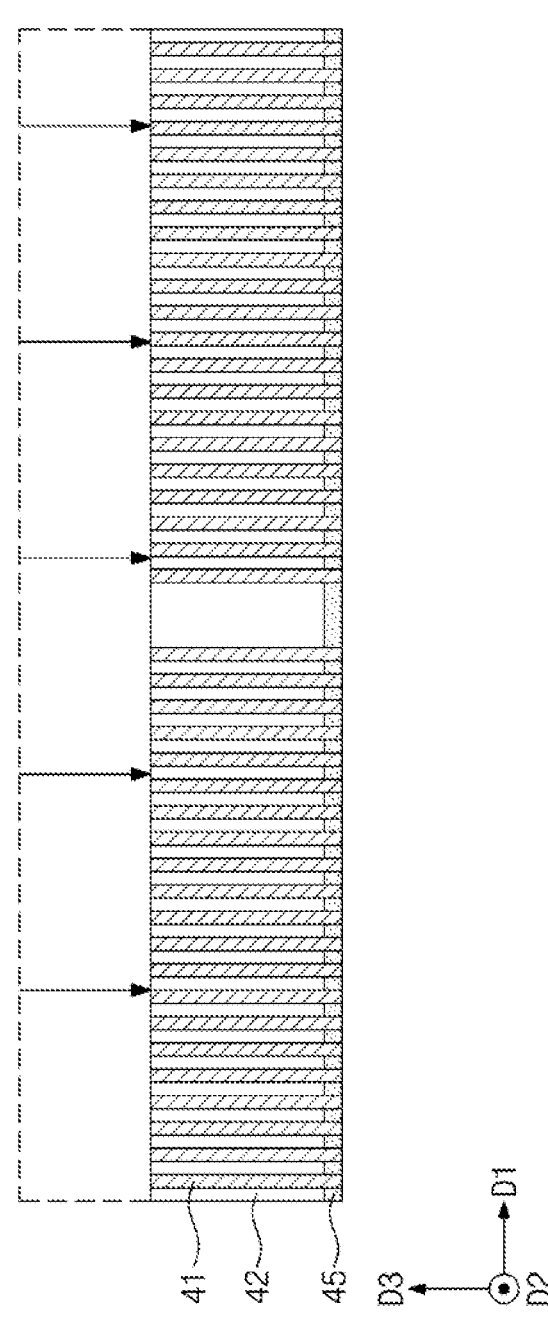

Referring to FIG. 10H, the second wafer 42P of FIG. 10G may be flipped such that a bottom surface of the second wafer 42P is exposed to the outside. Next, an etching process may be performed on the bottom surface of the second wafer 42P. In an embodiment, the etching process may be performed to expose a bottom surface of the penetration electrode 41. Thereafter, an etch-back or chemical mechanical polishing (CMP) process may be performed on the bottom surface of the second wafer 42P.

Figure 10I:
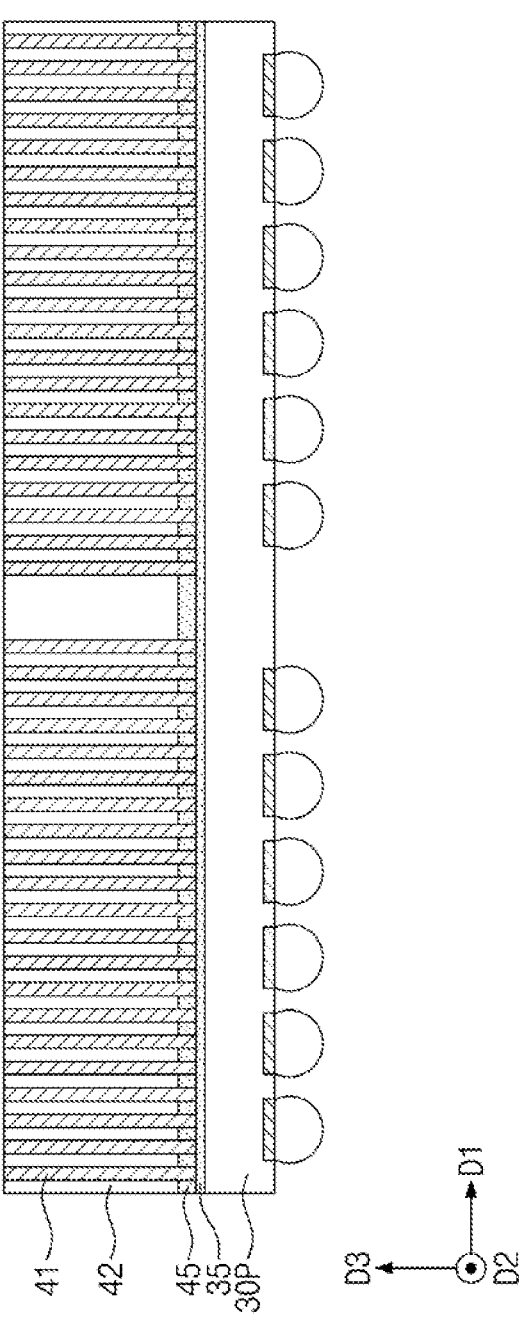

Referring to FIG. 10I, the second wafer 42P may be flipped again and then bonded to the first wafer 30P. That is, the first protection layer 35 may be bonded to the plurality of the penetration electrode 41 and the second protection layer 45. The bonding process may include exposing the first protection layer 35 and the second protection layer 45 to plasma of oxygen or nitrogen.

Figure 10J:
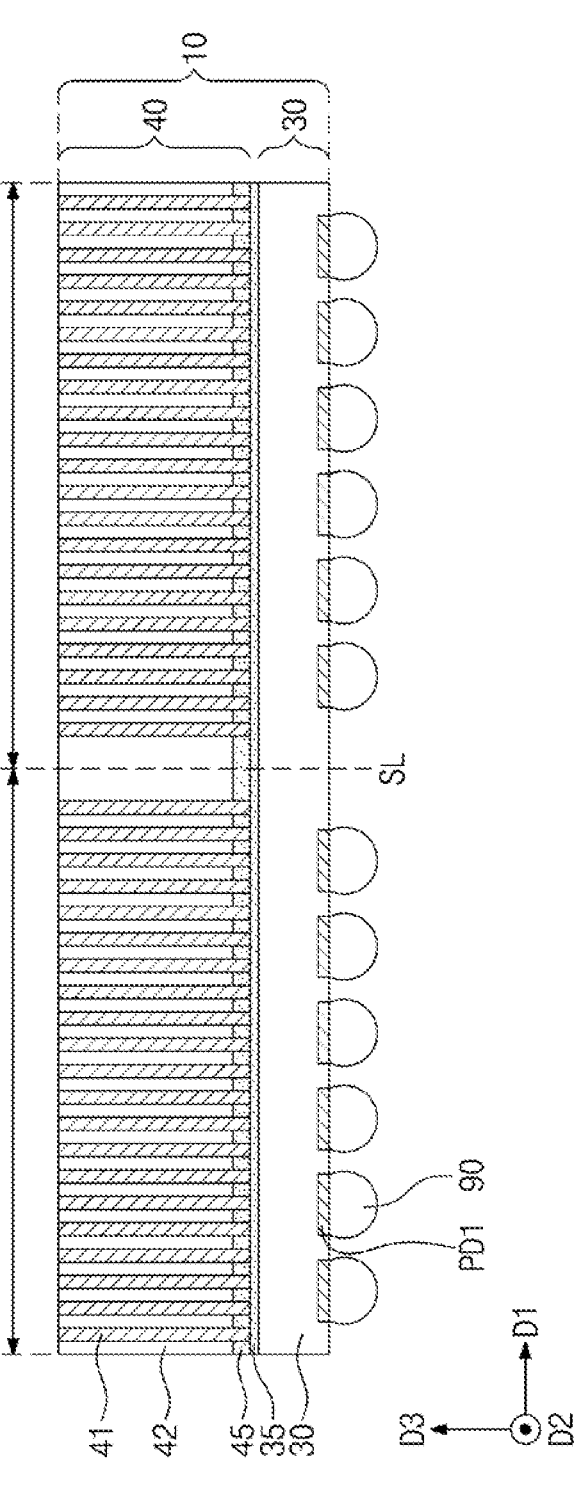

Next, referring to FIGS. 10J and 3, the first wafer 30P and the second wafer 42P may be cut along a sawing line SL to form the first chip structure 10 including the first semiconductor chip 30 and the dummy chip 40. The interposer substrate 20, the first chip structure 10, and the chip stack CS may be mounted on the package substrate 110 using the second connection terminals 92 and the third connection terminals 93. Thereafter, the first mold layer 170 may be formed to cover the side surface of the first chip structure 10 and the side surface of the chip stack CS, and as a result, the semiconductor package may have the same structure as the first semiconductor package 1.

FIGS. 11A to 11D are sectional views illustrating a process of fabricating a semiconductor package structure, according to an embodiment of the present disclosure.

Figure 11A:
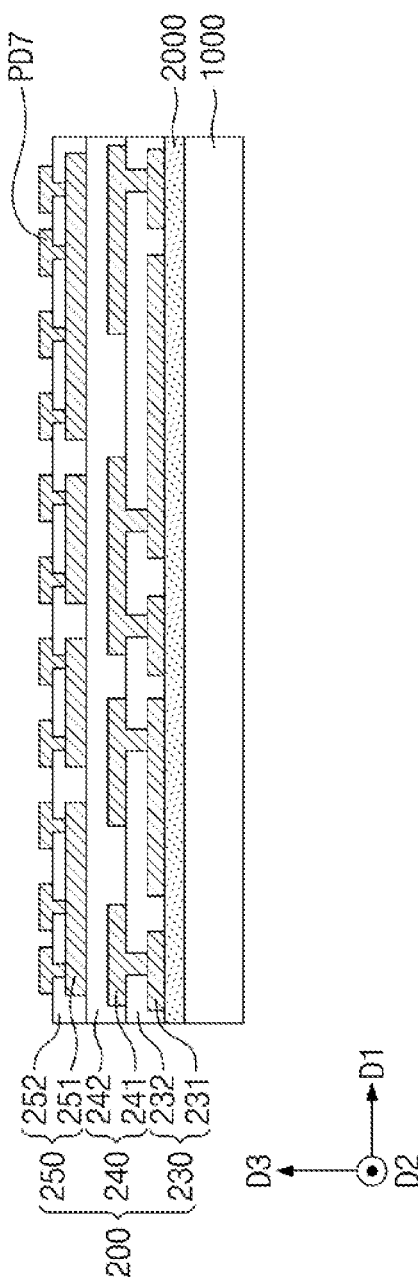
FIGS. 11A to 11D are sectional views illustrating a process of fabricating a semiconductor package structure, according to an embodiment of the present disclosure.

Referring to FIG. 11A, a carrier substrate 1000 and a release layer 2000 may be prepared. The release layer 2000 may be attached to the carrier substrate 1000. Next, the lower redistribution substrate 200 may be formed on the release layer 2000.

Figure 11B:
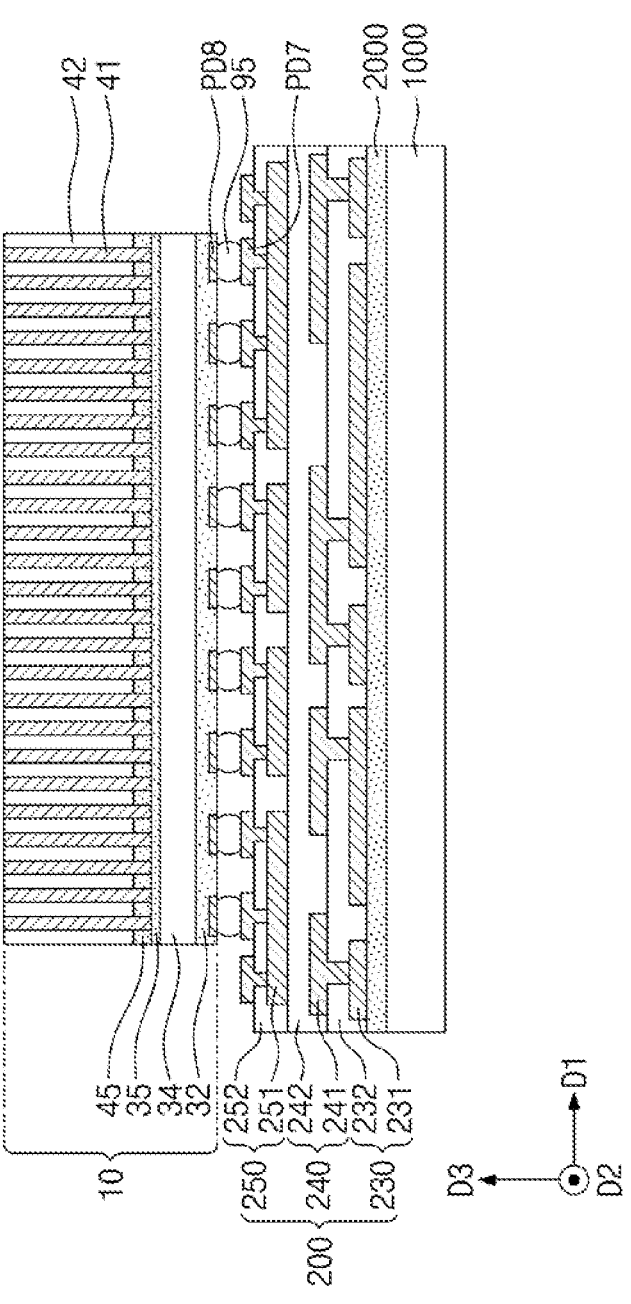

Referring to FIG. 11B, the first chip structure 10 may be mounted on the lower redistribution substrate 200. The mounting of the first chip structure 10 may include forming the plurality of the third connection terminal 95 on the plurality of the seventh pad PD7 and attaching the plurality of the eighth pad PD8, which are formed on the interconnection layer 32, to the plurality of the third connection terminal 95.

Figure 11C:
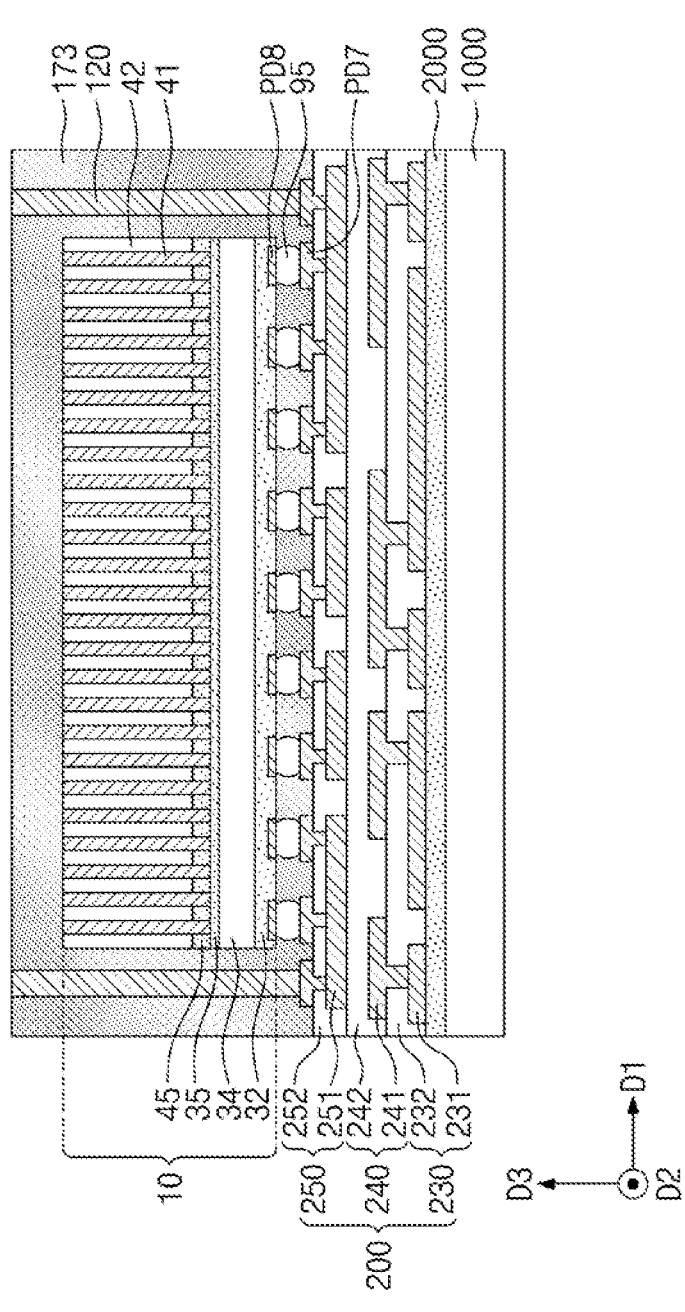

Referring to FIG. 11C, the conductive pillar 120 may be formed on one of plurality of the seventh pad PD7. The third mold layer 173 may be formed to cover the top surface of the lower redistribution substrate 200, the side surface of the conductive pillar 120, and the side and top surfaces of the first chip structure 10.

Thereafter, the release layer 2000 and the carrier substrate 1000 may be removed from the lower redistribution substrate 200. The removal of the release layer 2000 and the carrier substrate 1000 may be performed by a physical method.

Figure 11D:
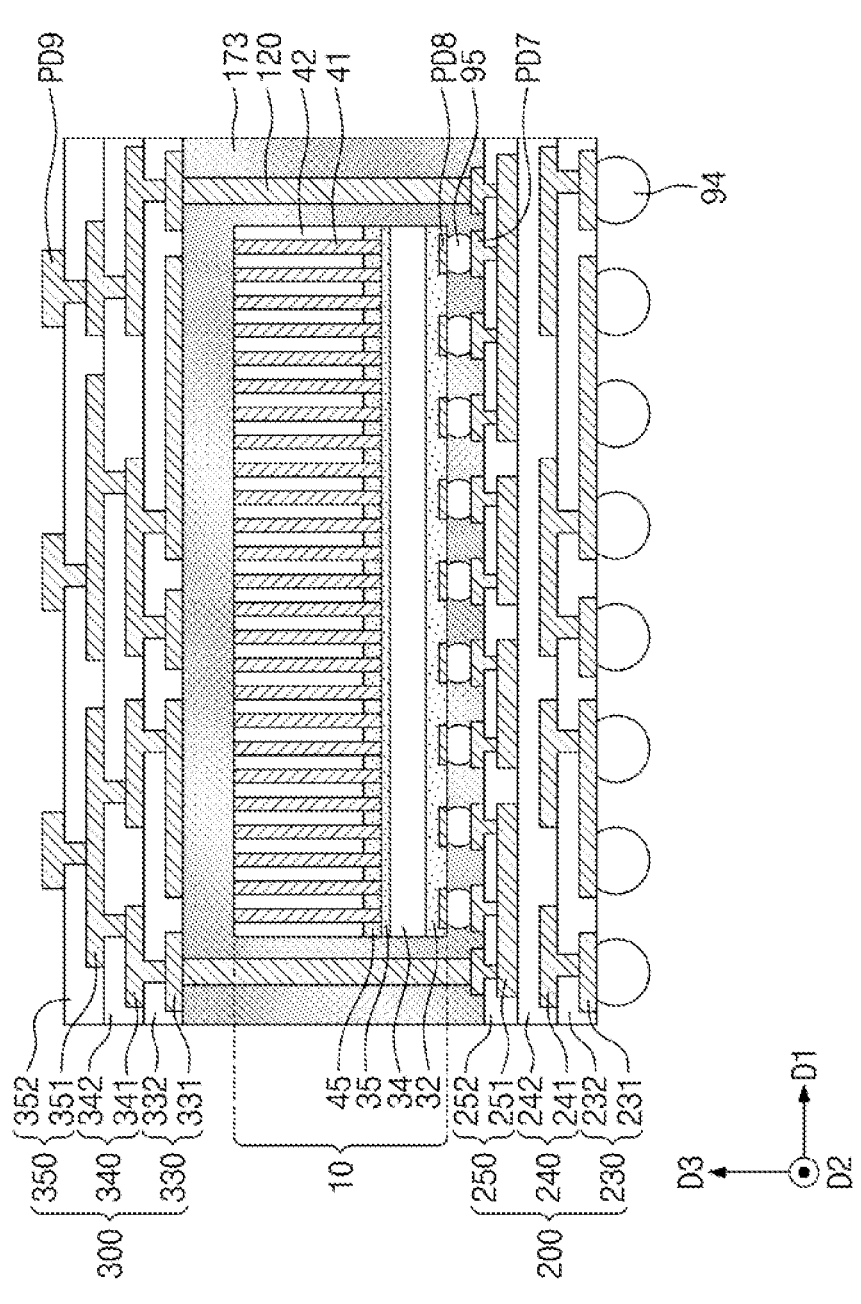

Referring to FIG. 11D, the plurality of the second outer connection terminal 94 may be formed on the bottom surface of the lower redistribution substrate 200. The upper redistribution substrate 300 may be formed on the top surface of the third mold layer 173. Thereafter, the second semiconductor chip 60 may be mounted on the upper redistribution substrate 300, and here, the second semiconductor chip 60 may be connected to the upper redistribution substrate 300 through the plurality of the sixth connection terminal 96.

Figure 12A:
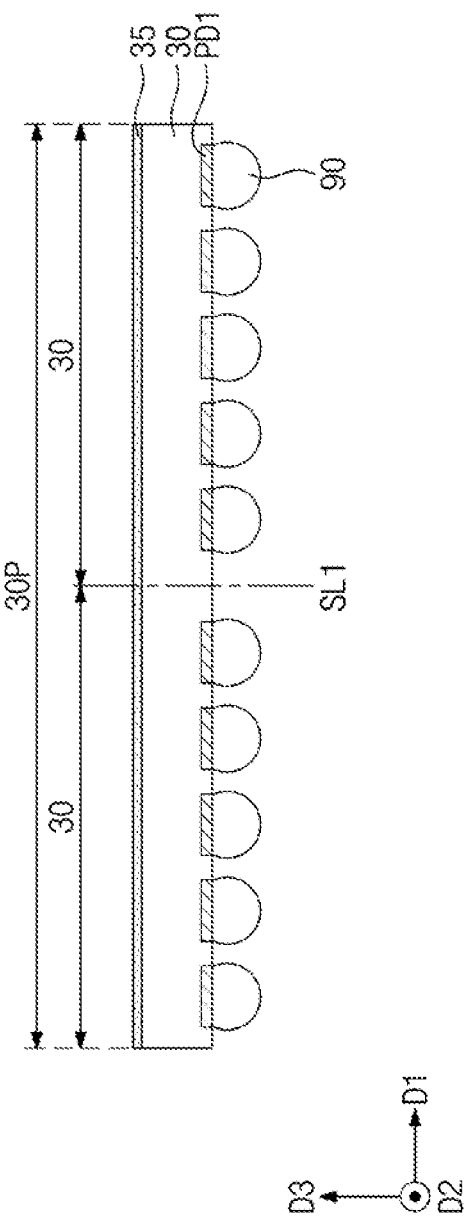
FIGS. 12A to 12C are sectional views illustrating a process of fabricating the semiconductor package structure of FIG. 7B.
Figure 12B:
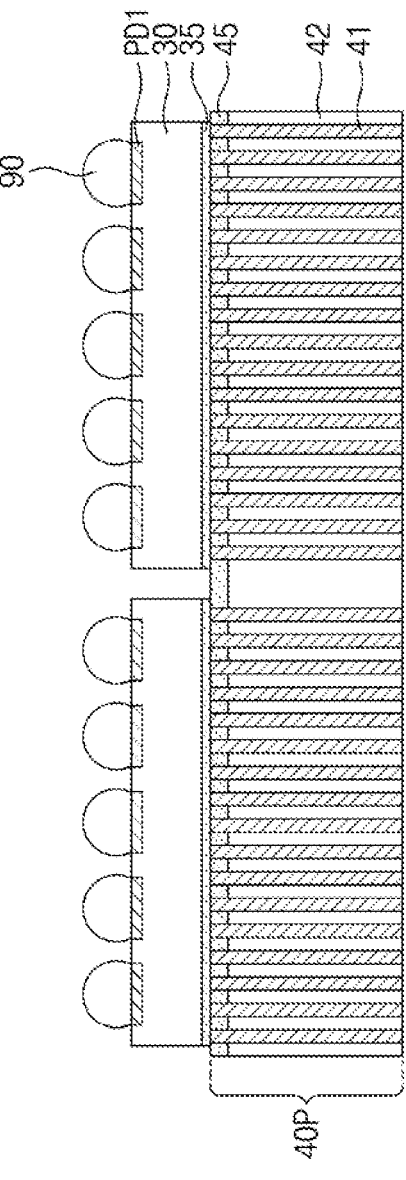
Figure 12C:
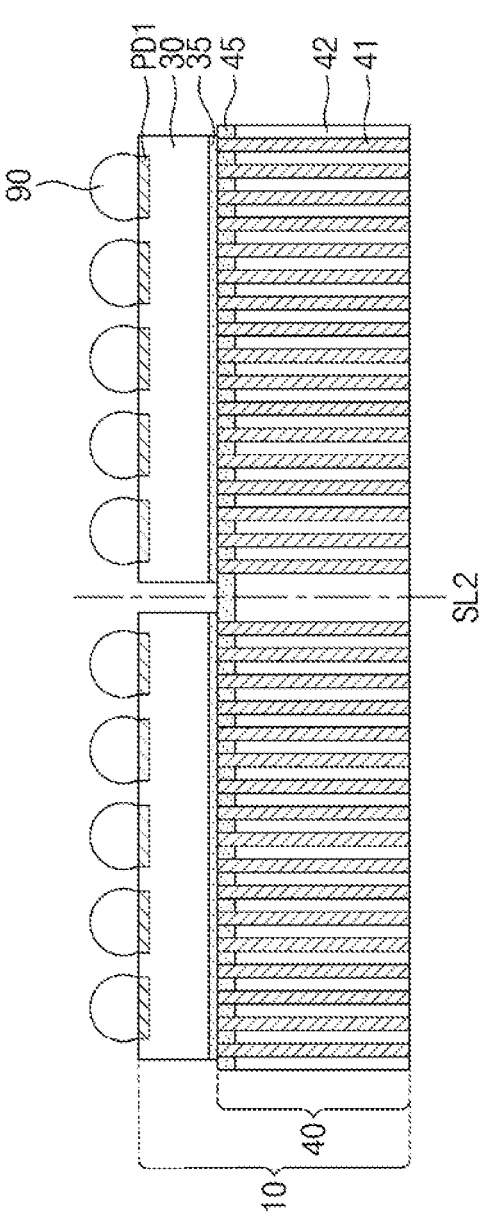

FIGS. 12A to 12C are sectional views illustrating a process of fabricating the semiconductor package structure of FIG. 7B.

Referring to FIG. 12A, the first protection layer 35 may be formed on the first wafer 30P. The first protection layer 35 may be formed by a chemical vapor deposition process. Thereafter, a sawing process may be performed on the first wafer 30P and the first protection layer 35 along the sawing line SL1. A plurality of the first semiconductor chip 30 may be formed by the sawing process.

Referring to FIG. 12B, the first semiconductor chip 30 may be bonded to a third wafer 40P by a hybrid bonding process. The bonding process may be substantially the same as the bonding process described with reference to FIG. 10I. The third wafer 40P may include a second semiconductor substrate 42, a plurality of a penetration electrode 41, and the second protection layer 45.

Referring to FIG. 12C, a sawing process may be performed on the third wafer 40P along the sawing line SL2. As a result of the sawing process, it may be possible to form a plurality of the first chip structure 10, each of which includes the dummy chip 40 and the first semiconductor chip 30.

Thereafter, the first chip structure 10 may be flipped, and then, the semiconductor package of FIG. 7B may be fabricated by a subsequent process, which is performed on the lower redistribution substrate 200 in a manner similar to that of FIGS. 11A to 11D.

Figure 13A:
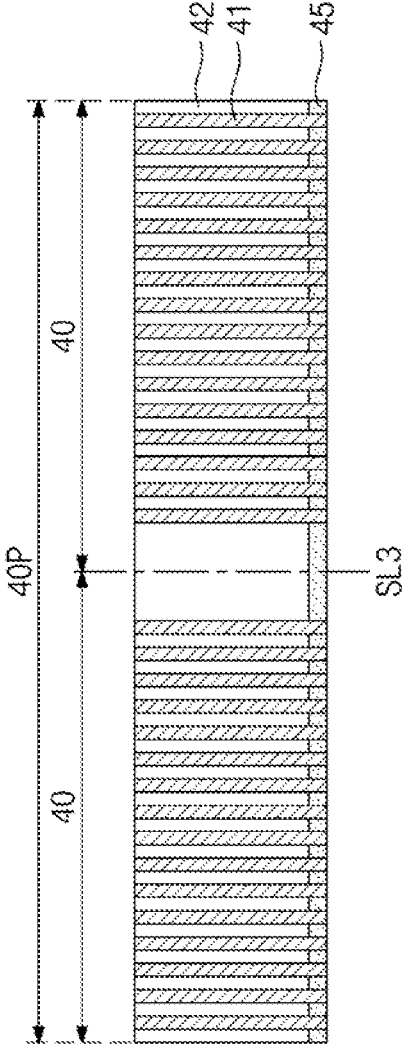
FIGS. 13A to 13C are sectional views illustrating a process of fabricating the semiconductor package structure of FIG. 7C.
Figure 13B:
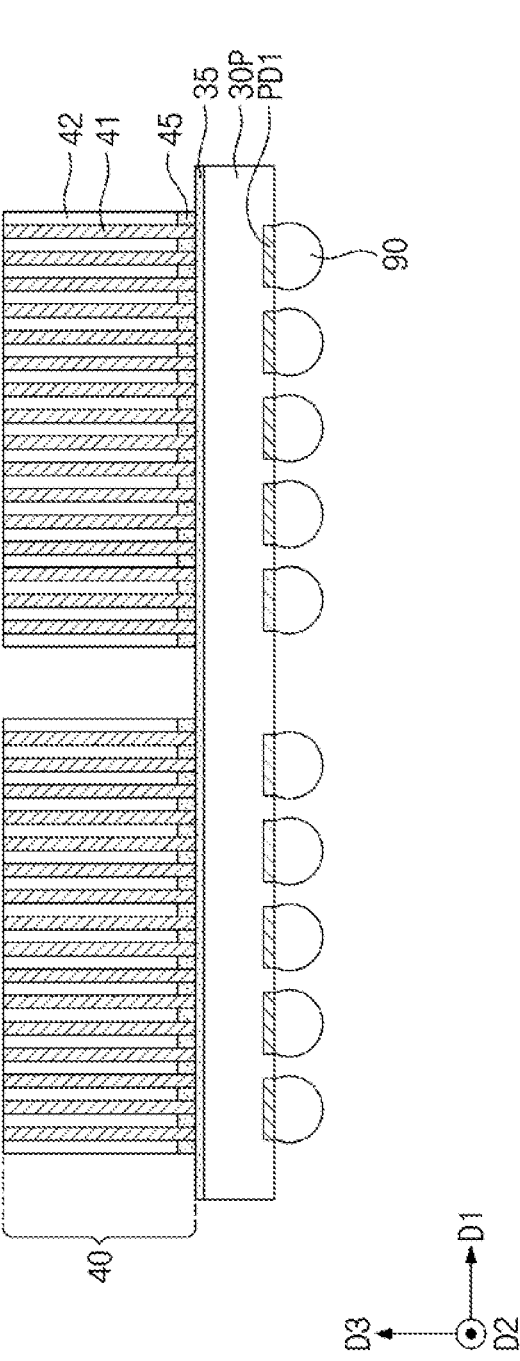
Figure 13C:
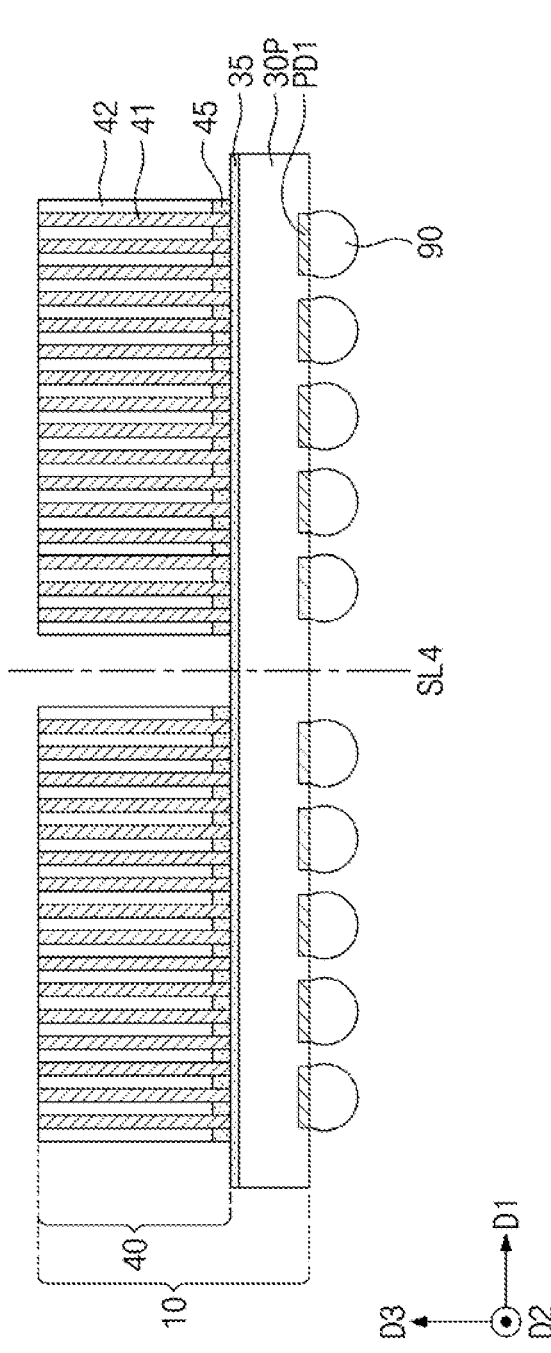

FIGS. 13A to 13C are sectional views illustrating a process of fabricating the semiconductor package structure of FIG. 7C.

Referring to FIG. 13A, a sawing process may be performed on the third wafer 40P along the sawing line SL3. A plurality of the dummy chip 40 may be formed by the sawing process.

Referring to FIG. 13B, the dummy chip 40 may be bonded to the first wafer 30P by a hybrid bonding process. The bonding process may be substantially the same as the bonding process described with reference to FIG. 10I.

Referring to FIG. 13C, a sawing process may be performed on the first wafer 30P along the sawing line SL. As a result of the sawing process, it may be possible to form a plurality of the first chip structure 10, each of which includes the dummy chip 40 and the first semiconductor chip 30.

Thereafter, the semiconductor package of FIG. 7C may be fabricated by a subsequent process, which is performed on the lower redistribution substrate 200 in a manner similar to that of FIGS. 11A to 11D.

According to an embodiment of the present disclosure, the semiconductor package may include a semiconductor chip and a dummy chip, which is disposed on the semiconductor chip and includes penetration electrodes. The penetration electrodes may be formed of or include a material (e.g., copper) having higher thermal conductivity than silicon, and thus, the penetration electrodes may be used to effectively exhaust heat, which is generated in the semiconductor chip, to the outside. In addition, the arrangement and shape of the penetration electrodes may be variably modified depending on a position of a heat source in the semiconductor chip and an amount of heat energy generated therefrom, and this may make it possible to maximize the heat-dissipation characteristics of the semiconductor package. Meanwhile, the semiconductor chip and the dummy chip may be bonded to each other by a hybrid bonding process, and in this case, the structural stability of the semiconductor package may be improved.

According to an embodiment of the present disclosure, a semiconductor package may include a semiconductor chip and a dummy chip on the semiconductor chip, and the dummy chip may include penetration electrodes. The penetration electrodes may be formed of or include copper, which has higher thermal conductivity than silicon, and in this case, heat generated in the semiconductor chip may be effectively exhausted to the outside through the penetration electrodes. In addition, the arrangement and shape of the penetration electrodes may be variably modified depending on a position of a heat source in the semiconductor chip and an amount of heat energy generated therefrom, and this may make it possible to maximize the heat-dissipation characteristics of the semiconductor package. Meanwhile, the semiconductor chip and the dummy chip may be bonded to each other through a hybrid bonding process using plasma. Due to the hybrid bonding process, an adhesive strength between the semiconductor chip and the dummy chip may be increased, and in this case, the structural stability of the semiconductor package may be improved.

While non-limiting example embodiments of the present disclosure have been particularly shown and described, it will be understood by one of ordinary skill in the art that variations in form and detail may be made therein without departing from the spirit and scope of the present disclosure.

What is claimed is:

1. A semiconductor package, comprising:
a substrate;
a semiconductor chip on the substrate;
a dummy chip on the semiconductor chip; and
a first protection layer between the semiconductor chip and the dummy chip,
wherein the dummy chip comprises:
    a semiconductor substrate comprising a first surface and a second surface, opposite to the first surface, the first surface being closer than the second surface to the semiconductor chip;
    a second protection layer on the first surface; and
    at least one penetration electrode penetrating the semiconductor substrate and the second protection layer,
wherein the at least one penetration electrode is spaced apart from the semiconductor chip in a first direction perpendicular to a top surface of the semiconductor chip, and
wherein the first protection layer is in contact with the second protection layer.

2. The semiconductor package of claim 1, wherein the semiconductor chip is a logic chip.

3. The semiconductor package of claim 1, wherein the at least one penetration electrode is in contact with a top surface of the first protection layer.

4. The semiconductor package of claim 1, wherein the first protection layer and the second protection layer comprise at least one from among $SiO_2$, SiN, SiCN, and SiCO.

5. The semiconductor package of claim 1, wherein a thickness of the second protection layer is in a range from 0.2 μm to 1 μm.

6. The semiconductor package of claim 1, wherein the semiconductor chip comprises a semiconductor substrate and an interconnection layer on the semiconductor substrate of the semiconductor chip, and
the first protection layer is in contact with the semiconductor substrate of the semiconductor chip.

7. The semiconductor package of claim 1, wherein the dummy chip further comprises a barrier metal on the at least one penetration electrode, and
the barrier metal comprises at least one from among titanium (Ti), titanium nitride (TiN), and tungsten (W).

8. The semiconductor package of claim 7, wherein the dummy chip further comprises a liner between the barrier metal and the semiconductor substrate, and
the liner comprises at least one from among silicon oxide ($SiO_2$) silicon nitride (SiN), silicon carbon nitride (SiCN), and silicon carboxide (SiCO).

9. The semiconductor package of claim 1, wherein a level of a top surface of the at least one penetration electrode is higher than a level of a top surface of the semiconductor substrate.

10. The semiconductor package of claim 1, further comprising:
an interposer substrate between the substrate and the semiconductor chip; and
a chip stack on the interposer substrate,
wherein the chip stack comprises a plurality of memory chips which are stacked.

11. The semiconductor package of claim 1, wherein the dummy chip further comprises a thermally conductive layer on the second surface of the semiconductor substrate.

12. The semiconductor package of claim 11, wherein the at least one penetration electrode penetrates the thermally conductive layer.

13. The semiconductor package of claim 11, wherein a thickness of the thermally conductive layer is in a range from 10 μm to 100 μm.

14. The semiconductor package of claim 11, wherein the thermally conductive layer comprises at least one from among aluminum (Al), aluminum oxide ($Al_2O_3$), aluminum nitride (AlN), magnesium oxide (MgO), and silicon carbide (SiC).

15. The semiconductor package of claim 1, wherein
the dummy chip comprises a first region and a second region,
the at least one penetration electrode is a plurality of penetration electrodes,
some of the plurality of penetration electrodes are in the first region, and others of the plurality of penetration electrodes are in the second region, and
a number of the plurality of penetration electrodes per unit area in the first region is greater than a number of the plurality of penetration electrodes per unit area in the second region.

16. The semiconductor package of claim 1, wherein the semiconductor chip comprises a first width in a second direction parallel to the top surface of the semiconductor chip, the dummy chip comprises a second width in the second direction, and the first width is smaller than the second width.

17. The semiconductor package of claim 1, wherein the semiconductor chip comprises a first width in a second direction parallel to the top surface of the semiconductor chip, the dummy chip has a second width in the second direction, and the first width is larger than the second width.

18. A semiconductor package, comprising:

a substrate;

a semiconductor chip on the substrate;

an interposer substrate between the substrate and the semiconductor chip;

a chip stack on the interposer substrate;

a dummy chip on the semiconductor chip; and a first protection layer between the semiconductor chip and the dummy chip, wherein the chip stack is spaced apart from the semiconductor chip in a first direction parallel to a top surface of the semiconductor chip, wherein the dummy chip comprises:

a semiconductor substrate comprises a first surface and a second surface, opposite to the first surface, the first surface being closer than the second surface to the semiconductor chip;

a second protection layer on the first surface; and a penetration electrode penetrating the semiconductor substrate and the second protection layer, wherein the penetration electrode is spaced apart from the semiconductor chip in a second direction perpendicular to the top surface of the semiconductor chip, and wherein the first protection layer is in contact with the second protection layer.

19. A semiconductor package, comprising:

a first sub-package; and a second sub-package on the first sub-package, wherein the first sub-package comprises:

a lower redistribution substrate;

a first semiconductor chip on the lower redistribution substrate;

a dummy chip on the first semiconductor chip; and a first protection layer between the first semiconductor chip and the dummy chip, wherein the dummy chip comprises:

a semiconductor substrate comprising a first surface and a second surface, opposite to the first surface, the first surface being closer than the second surface to the first semiconductor chip;

a second protection layer on the first surface; and a penetration electrode penetrating the semiconductor substrate and the second protection layer, wherein the penetration electrode is spaced apart from the first semiconductor chip in a first direction perpendicular to a top surface of the first semiconductor chip, wherein the first protection layer is in contact with the second protection layer, and wherein the second sub-package comprises:

an upper redistribution substrate;

a second semiconductor chip on the upper redistribution substrate; and an upper substrate between the upper redistribution substrate and the second semiconductor chip.

20. The semiconductor package of claim 19, wherein the first semiconductor chip is a logic chip, and the second semiconductor chip is a memory chip.

* * * * *